(12) United States Patent
Komatsu et al.

(10) Patent No.: US 8,491,998 B2
(45) Date of Patent: Jul. 23, 2013

(54) COMPOSITE NANOMETAL PASTE OF TWO-METALLIC-COMPONENT TYPE, BONDING METHOD, AND ELECTRONIC PART

(75) Inventors: Teruo Komatsu, Osaka (JP); Ryo Matsubayashi, Hanno (JP)

(73) Assignees: Applied Nanoparticle Laboratory Corporation, Osaka (JP); Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/383,814

(22) PCT Filed: Jul. 16, 2009

(86) PCT No.: PCT/JP2009/062925
§ 371 (c)(1),
(2), (4) Date: Jan. 12, 2012

(87) PCT Pub. No.: WO2011/007442
PCT Pub. Date: Jan. 20, 2011

(65) Prior Publication Data
US 2012/0114972 A1    May 10, 2012

(51) Int. Cl.
*B32B 5/16* (2006.01)
(52) U.S. Cl.
USPC ........... 428/403; 428/404; 428/405; 428/406; 428/407; 428/323; 428/328; 977/773; 977/778; 977/810; 977/932
(58) Field of Classification Search
USPC ................. 428/403–407, 323, 328; 977/773, 977/778, 810, 932
See application file for complete search history.

(56) References Cited

U.S. PATENT DOCUMENTS

| | | | |
|---|---|---|---|
| 2001/0003362 A1* | 6/2001 | Sano et al. | 252/512 |
| 2004/0026669 A1* | 2/2004 | Sano et al. | 252/500 |
| 2005/0161643 A1* | 7/2005 | Sano et al. | 252/512 |

FOREIGN PATENT DOCUMENTS

| | | | |
|---|---|---|---|
| JP | H06-215617 A | | 8/1994 |
| JP | 2001-176325 A | | 6/2001 |
| JP | 3205793 B | | 9/2001 |
| JP | 2003-342605 A | | 12/2003 |
| JP | 2004-107728 A | | 4/2004 |
| JP | 2005-203304 | * | 7/2005 |
| JP | 2005-203304 A | | 7/2005 |
| JP | 2007-95510 A | | 4/2007 |
| JP | 2007-297671 A | | 11/2007 |
| JP | 2009-138242 | * | 6/2009 |
| JP | 2009-138242 A | | 6/2009 |
| WO | WO 00/76699 A | | 12/2000 |
| WO | WO 01/70435 A | | 9/2001 |
| WO | WO 2005/075132 A | | 8/2005 |

* cited by examiner

*Primary Examiner* — Leszek Kiliman
(74) *Attorney, Agent, or Firm* — DLA Piper LLP (US)

(57) ABSTRACT

Provided is a composite nanometal paste, whose layer, when sintered in an inert gas under no load, gives a metal layer that is equal or superior in electrical conductivity and thermal conductivity to conventional lead-rich solders. The composite nanometal paste contains, as metal components, composite metal nanoparticles comprising metal cores with an average particle diameter of d (nm) and an organic coating layer formed around the circumference, and metal filler particles having an average particle diameter of D (nm), and satisfies the first relation d<D and the second relation d<100 (nm). When said organic coating layer volatilizes so that a metal layer is formed by sintering, the size relation between said average particle diameters d, D is designed so that said composite metal nanoparticle can be embedded in a hollow four pocket formed when it is assumed that four said metal filler particles are placed so that they come in contact with a tetrahedron, and it has a property in which said composite metal nanoparticles and said metal filler particles sinter compactly.

17 Claims, 25 Drawing Sheets

FIG. 1

Chemical reaction in low-temperature production of composite silver nanoparticles Raw materials      Silver compound: Silver salt      (1)

Alcohol:   $C_nH_{2n+1}OH$   $(1 \leq n \leq 12)$ $= R_nOH$      (2)

$R_n = C_nH_{2n+1}$      (3)

[1] First step: Alcohol adsorption on surface of silver salt particles (Many silver salts are insoluble in alcohols)

Alcohol molecule $R_nOH$ serves as a surfactant $R_n$: Hydrophobic group    OH: Hydrophilic group Hydrophilic group faces toward alcohol, hydrophilic group is adsorbed to hydrophilic surface of silver salt particle

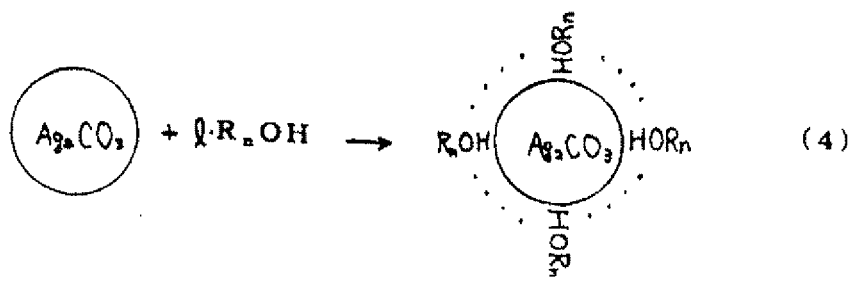

Chemical reaction in low-temperature production of composite silver nanoparticles

[2] Second step: Thermolysis-reduction reaction at surface of silver salt particles
(Case where the silver salt particles are silver carbonate)

<Thermolysis process>

$$Ag_2CO_3 + R_nOH \rightarrow 2Ag + R_{n-1}CHO + CO_2 + H_2O \qquad (5)$$

$$Ag_2CO_3 + 2R_nOH \rightarrow 2AgOR_n + CO_2 + H_2O \qquad (6)$$

<Reduction process by aldehyde>

$$Ag_2CO_3 + R_{n-1}CHO \rightarrow 2Ag + R_{n-1}COOH + CO_2 \qquad (7)$$

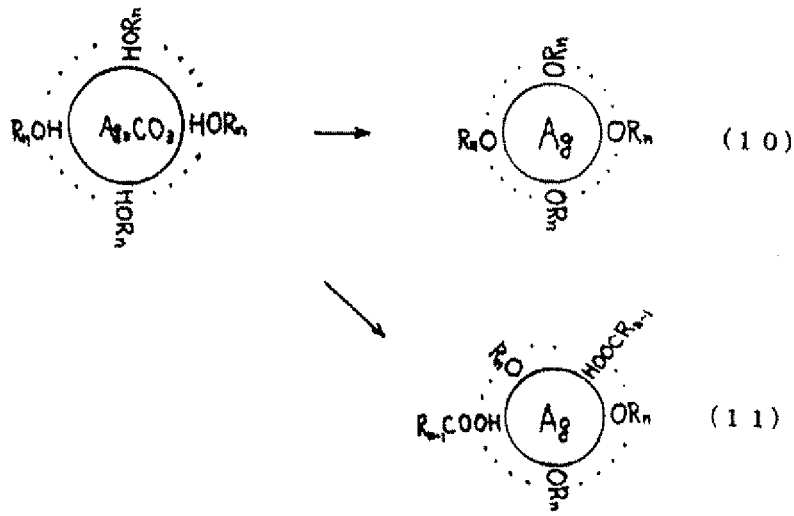

FIG. 7

⟨ Conditions of Characteristic Temperatures of Powder ⟩

Powder : C1AgAL ～ C12AgAL

Thermal analysis under atmosphere: TG, DTA $T_1$(°C): Decomposition start temperature: TG decrease start temperature $T_2$(°C): Decomposition temperature: DTA peak temperature $T_3$(°C): Silverization temperature :DTA final peak temperature, or DTA final peak finishing temperature (TG stabilizing temperature)

PT(°C): Production temperature (1) Temperature increase rate : VT= 1°C／min

| | |
|---|---|
| $T_1 < T_2 < T_3$ | (C1) |
| $T_2 - 100 < T_1 < T_2$ | (C2) |
| $T_3 \leq 200$ | (C3) |
| $PT < T_3$ | (C4) |

(2) Temperature increase rate :

$1(°C／min) \leq VT \leq 20(°C／min)$

| | |
|---|---|
| $T_1(VT) < T_2(VT) < T_3(VT)$ | (C5) |
| $T_2(VT) - 100 < T_1(VT) < T_2(VT)$ | (C6) |
| $T_3(VT) < T_3(1°C／min) + 100$ | (C7) |

FIG. 8

Composite nanometal paste containing two metallic components that fulfills the following conditions for forming a compact metal layer <Contains following two types of metallic components>

① Composite metal nanoparticles in which organic coating layer is formed at circumference of metal core with average particle diameter d(nm) : NS ② Metal filler particles with average particle diameter D(nm) : F <Particle diameter conditions>

① First relation: $d < D$ (12)

② Second relation: $d < 100$ (13)

③ Third relation: Composite metal nanoparticle NS can be embedded in four pocket of metal filler particles F that constitutes tetrahedron (14)

Equation 14 of the third relation above is mathematically equivalent to Equations 15 and 16

④ Third relation: $d \leq (\sqrt{3}/\sqrt{2} - 1)D$ (15)

That is to say, $d \leq 0.2247D$ (16)

FIG. 9

<Particle diameter conditions for metal layer to sinter compactly>

Hypothesis: Four metal filler particles F of average particle diameter F mutually contact and are placed to form a tetrahedron

↓

Centers A, B, C, D of metal filler particles F form tetrahedron ABCD with edges 2R

↓

Four pocket P, which is a gap, is formed at center of tetrahedron ABCD

↓

Inscribed sphere N S max with radius $r_0$ is placed in four pocket P

↓ r : Radius of metal core of composite metal nanoparticle N S

↓

Radius filling condition : $0 < r \leq r_0$    (17)

FIG. 12

<Proof of $r_0 = (\sqrt{3}/\sqrt{2} - 1)R$>

Center of gravity of tetrahedron ABCD: Q

QA = QB = QC = QD = x $$x = R + r_0 \qquad (18)$$

O: Crossing point between extension line of DQ and equilateral triangle ABC

Simultaneously, center of gravity of equilateral triangle ABC $$AO = BO = AM \times 2/3 \qquad (19)$$

$$AO = BO = 2R\sin(60°) \times 2/3 = (2/\sqrt{3})R \qquad (20)$$

△ODB : Right triangle $$\therefore DB^2 = DO^2 + BO^2 \qquad (21)$$

$$(2R)^2 = H^2 + \{(2/\sqrt{3})R\}^2 \qquad (22)$$

$$\therefore H = (2\sqrt{2}/\sqrt{3})R \qquad (23)$$

△AQO : Right triangle $$\therefore AQ^2 = AO^2 + OQ^2 \qquad (24)$$

$$x^2 = \{(2/\sqrt{3})R\}^2 + [H-x]^2 \qquad (25)$$

$$\therefore \quad = \{(2/\sqrt{3})R\}^2 + [\{(2\sqrt{2}/\sqrt{3})R\}-x]^2 \qquad (26)$$

$$x = (\sqrt{3}/\sqrt{2})R \qquad (27)$$

$$\therefore r_0 = x - R = (\sqrt{3}/\sqrt{2}-1)R \qquad (28)$$

$$r_0 = 0.2247R \qquad (29)$$

FIG. 13

<Third relation: Eq.(15) Proof of $d \leq (\sqrt{3}/\sqrt{2}-1)$>

$$\text{Radius filling condition}: 0 < r \leq r_0 \quad (17)$$

$$\therefore \text{Particle diameter filling condition}: 0 < 2r \leq 2r_0 \quad (30)$$

Ave. metal core diameter $d$ of composite metal nanoparticles $$\rightarrow d = 2r \quad (31)$$

Ave. particle diameter $D$ of metal filler particles $F$ $$\rightarrow D = 2R \quad (32)$$

$$0 < d \leq 2r_0 = 2(\sqrt{3}/\sqrt{2}-1)R$$

$$\therefore \text{Particle diameter filling condition}: 0 < d \leq (\sqrt{3}/\sqrt{2}-1)D \quad (33)$$

$$\text{or} \quad 0 < d \leq 0.2247D \quad (34)$$

∴ Filling condition : It is necessary that average particle diameter d of composite metal nanoparticles be smaller than 0.2247 times average particle diameter D of metal filler particles

FIG. 14

<Determination of minimum filling factor $X_{min}$ of composite metal nanoparticle NS>

Assumption: Four metal filler particles F of average radius R are placed so that they contact mutually, and form a tetrahedron

↓

Volume $V_o$ of tetrahedron ABCD: Volume of entire two-component metals ($V_o$ = Volume of metal filler particles F + composite metal nanoparticles NS)

Volume $v_o$ of four pocket P: Volume of composite metal nanoparticles NS

↓

Minimum filling factor $X_{min}$ : $v_o / V_o$     (35)

↓

$$V_0 = (2\sqrt{2}/3)R^3 \quad (36)$$

$$v_0 = \{(2\sqrt{2}/3) - 4\cos^{-1}(1/3) + 4\pi/3\}R^3 \quad (37)$$

↓

$$X_{min} = v_0/V_0 = 1 - 3\sqrt{2}\cos^{-1}(1/3) + \sqrt{2}\pi \quad (38)$$

$$X_{min} = 0.22036 \quad (39)$$

FIG. 15

<Tetrahedron volume $V_0$: Proof of Eq. (36): See Fig. 11>

$$V_0 = (1/3) \times \text{area of } \triangle ABC \times DO \qquad (40)$$

$$\begin{aligned}
\text{Area of } \triangle ABC &= (1/2) \times BC \times AM \\
&= (1/2) \times 2R \times 2R\sin(60°) \\
&= (1/2) \times 2R \times 2R(\sqrt{3}/2) \\
&= \sqrt{3} R^2 \qquad (41)
\end{aligned}$$

$$DO = H = (2\sqrt{2}/\sqrt{3})R \qquad (23)$$
$$(\because \text{Eq. (23)})$$

$$\begin{aligned}
V_0 &= (1/3) \times \text{area of } \triangle ABC \times DO \\
&= (1/3) \times \sqrt{3} R^2 \times (2\sqrt{2}/\sqrt{3})R \\
&= (2\sqrt{2}/3) R^3 \qquad (36)
\end{aligned}$$

FIG. 17

⟨Four pocket volume $v_0$: Proof of Eq. (37): See Fig. 16⟩

Area of spherical triangle KLN, by area formula: $S_0$ $S_0/R^2 = K + L + N - \pi$      (42)

$k = l = n = 60° = \pi/3$      (43)

Cosine theorem of spherical trigonometry $\cos(k) = \cos(l)\cos(n) + \sin(l)\sin(n)\cos(K)$      (44)

∴ From Eq. (44), $1/2 = (1/2)^2 + (\sqrt{3}/2)^2 \cos(K)$

∴ $\cos(K) = 1/3$      (45)

Similarly $\cos(L) = \cos(N) = 1/3$      (46)

∴ $K = L = N = \cos^{-1}(1/3)$      (47)

When Eq. (47) is substituted into Eq. (42)

$S_0 = \{3\cos^{-1}(1/3) - \pi\}R^2$      (48)

Area $S_0$ of spherical triangle KLN and volume $vv_0$ of solid AKLN are proportional, therefore the solid and the sphere are compared ∴ $S_0 : 4\pi R^2 = vv_0 : (4\pi/3)R^3$      (49)

∴ $vv_0 = \{\cos^{-1}(1/3) - \pi/3\}R^3$      (50)

Volume of four solids: $4vv_0$      (51)

∴ $4vv_0 = 4\{\cos^{-1}(1/3) - \pi/3\}R^3$      (52)

From Eqs. (36) and (52), four pocket volume $v_0$ $= V_0 - 4vv_0$      (53)

$v_0 = (2\sqrt{2}/3)R^3 - 4\{\cos^{-1}(1/3) - \pi/3\}R^3$      (54)

∴ $v_0 = \{2\sqrt{2}/3 - 4\cos^{-1}(1/3) + 4\pi/3\}R^3$      (37)

FIG. 18

<Determination of filling factor X of composite metal nanoparticles NS>

Assumption: Four metal filler particles F of average particle diameter R are separated by distance $2\Delta$ and form enlarged tetrahedron $\downarrow$ Volume V of enlarged tetrahedron ABCD: Volume of entire two component metals
(V = Volume of metal filler particles F + Volume of composite metal nanoparticles N S)
Volume v of enlarged four pocket: Volume of composite metal nanoparticle N S $\downarrow$ $\qquad$ Filling ratio X : v / V $\qquad$ (55)

$\downarrow$

Volume of tetrahedron under mutual contact:
$\qquad V_0 = (2\sqrt{2}/3) R^3 \qquad$ (36)
$\qquad$ Conversion : R→R+$\Delta$ $\qquad$ (56)

$\downarrow$

Volume of enlarged tetrahedron ABCD: V
$\qquad V = (2\sqrt{2}/3)(R+\Delta)^3 \qquad$ (57)

$\downarrow$

Volume of enlarged four pocket: v (Using Eq. (52))
$\qquad v = V - 4vv_0 \qquad$ (58)
$\qquad v = (2\sqrt{2}/3)(R+\Delta)^3 - 4\{\cos^{-1}(1/3) - \pi/3\}R^3 \qquad$ (59)
(Using radius enlargement ratio X) $\quad \downarrow$
$\qquad \Delta = Rx \qquad$ (60)
$\qquad V = (2\sqrt{2}/3)R^3(1+x)^3 \qquad$ (61)
$\qquad v = (2\sqrt{2}/3) R^3(1+x)^3 - 4\{\cos^{-1}(1/3) - \pi/3\}R^3 \qquad$ (62)

$\downarrow$ $\qquad X = v/V = 1 - 3\sqrt{2}\{\cos^{-1}(1/3) - \pi/3\}/(1+x)^3 \qquad$ (63)
$\qquad X = 1 - 0.77963/(1+x)^3 \qquad$ (64)

FIG. 20

<Range of filling factor X of composite metal nanoparticle N S>

General expression of filling factor X ($x \geq 0$)

$$X = v/V = 1 - 3\sqrt{2}\{\cos^{-1}(1/3) - \pi/3\}/(1+x)^3 \quad (63)$$

$$X = 1 - 0.77963/(1+x)^3 \quad (64)$$

↓

Minimum filling factor ($X_{min}$) : Four pocket of tetrahedron in which composite metal nanoparticles are in mutual contact is densely filled $$\Delta = 0$$

$$X = 0 \quad (65)$$

↓

$$X_{min} = v_0/V_0 = 1 - 3\sqrt{2}\cos^{-1}(1/3) + \sqrt{2}\pi \quad (38)$$

$$X_{min} = 0.22036 \quad (39)$$

Maximum filling factor ($X_{max}$) : From spacing $2\Delta$ of four metal filler particles of enlarged tetrahedron, another metal filler particle does not intrude into enlarged four pocket $$\Delta = R$$

$$X = 1 \quad (66)$$

↓

$$X_{max} = v/V = 1 - 3\sqrt{2}\{\cos^{-1}(1/3) - \pi/3\}/8 \quad (67)$$

$$X_{max} = 1 - 0.77963/8$$

$$= 0.90254 \quad (68)$$

From above, theoretical range of filling factor X of composite metal nanoparticle $$0.22036 \leq X \leq 0.90254 \quad (69)$$

FIG. 21

< Estimation of elastic minimum filling factor $X_{fmin}$ of composite metal nanoparticle NS >

Empirical rule: Metal layer bonds strongly after sintering → Half or more of four pocket P is filled with composite metal nanoparticle P → Four pocket P is filled with composite metal nanoparticles NS of two or more inscribed spheres $NS_{max}$

↓

Radius $r_0$ of inscribed sphere $NSmax = (\sqrt{3}/\sqrt{2} - 1)R$ (28)
Volume of inscribed sphere NSmax    $nv = (4\pi/3)r_0^3$ (70)
∴    $nv = (4\pi/3)(\sqrt{3}/\sqrt{2} - 1)^3 R^3$ (71)

↓

Volume of tetrahedron ABCD: $V_0 = (2\sqrt{2}/3)R^3$ (36)

↓

Filling factor NSmax of one inscribed sphere
$$nv/V_0 = (4\pi/3)(\sqrt{3}/\sqrt{2} - 1)^3 R^3 / (2\sqrt{2}/3)R^3$$
$$= \sqrt{2}(\sqrt{3}/\sqrt{2} - 1)^3 \pi \quad (72)$$
$$= 0.0504 \quad (73)$$

↓

Filling factor of four pocket P : $X_{min} = 0.22036$ (39)
How many times the volume of inscribed sphere is the volume of four pocket P?
$$X_{min}/(nv/V_0) = 4.3722 \quad (74)$$

↓

General expression : $X_{min} = 0.22036 \times k$ ($0.45 \leq k \leq 1$) (75)

↓

As experimental empirical rule, if k times four pocket P ($0.45 \leq k \leq 1$) can be filled with composite metal nanoparticles, a strong metal layer can be formed.

↓

Elastic minimum filling factor: $X_{fmin} = 0.10$ (76)
∴    Theoretical elastic filling factor range : $0.10 \leq X \leq 0.90$ (77)

FIG. 23

⟨Relations between Characteristic Temperatures of Powder and Those of Paste⟩

Powder : C1AgAL ∼ C12AgAL

Paste : PC1AgAL ∼ PC12AgAL (1) Temperature increase rate : VT= 1℃/min $Tp1 < Tp2 < Tp3$ (P1)

$Tp2-100 < Tp_1 < Tp_2$ (P2)

$Tp3 \leqq 300$ (P3)

(2) Temperature increase rate :

$1(℃/min) \leqq VT \leqq 20(℃/min)$ $Tp1(VT) < Tp2(VT) < Tp3(VT)$ (P4)

$Tp2(VT)-100 < Tp1(VT) < Tp2(VT)$ (P5)

$Tp3(VT) < Tp3(1℃/min)+100$ (P6)

(3) Relations between characteristic temperatures of powder and those of paste $T_1(VT) < Tp_1(VT) < T_1(VT)+100$ (P7)

$T_2(VT) < Tp_2(VT) < T_2(VT)+100$ (P8)

$T_3(VT) < Tp_3(VT) < T_3(VT)+100$ (P9)

FIG. 24
(24A)
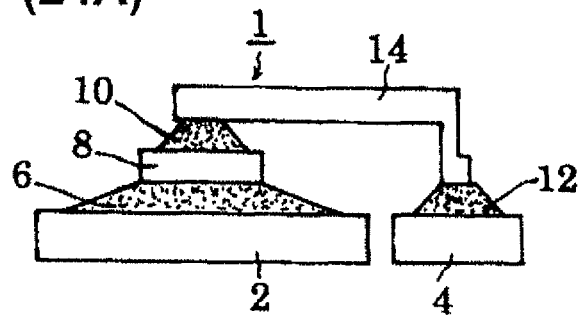
(24B)
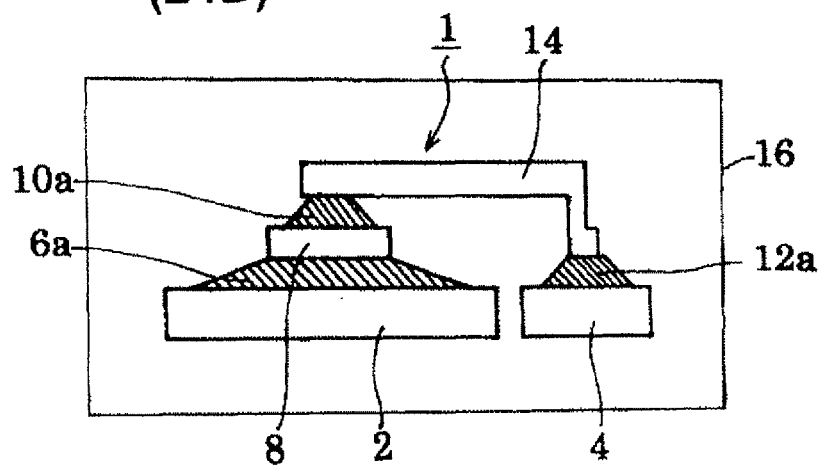
(24C)
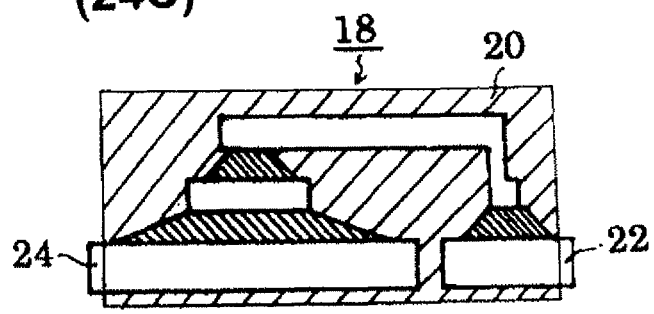

FIG. 25
(25A)
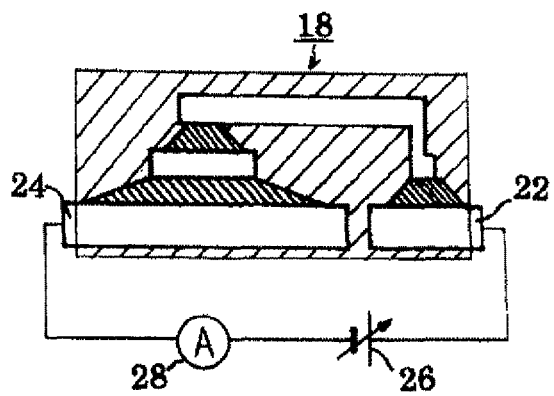
(25B)
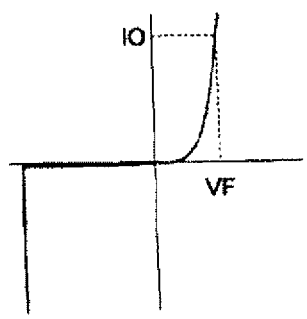
(25C)
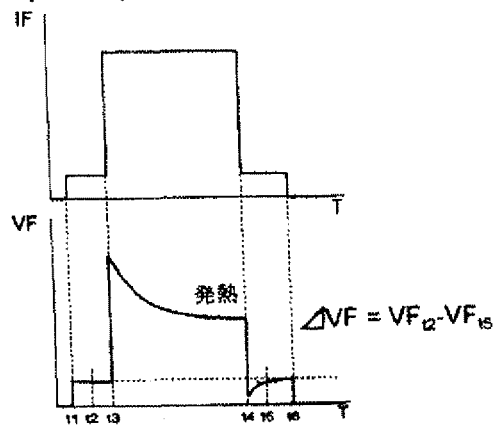

COMPOSITE NANOMETAL PASTE OF TWO-METALLIC-COMPONENT TYPE, BONDING METHOD, AND ELECTRONIC PART

FIELD OF THE INVENTION

The present invention concerns a composite nanometal paste containing composite metal nanoparticles in which an organic coating layer is formed at a circumference of a metal core, and especially in particular, it concerns a composite nanometal paste, a method of bonding, and an electronic component in which said composite nanometal paste is metalized by heating at predetermined temperature and volatilizing said organic coating layer.

BACKGROUND ART

Normally, semiconductors, electronic circuits, and electronic devices, among others, have various electronic components fused and fastened to a substrate using solder, to obtain electric conductivity. However, the conventional solders are an alloy of Sn and Pb, and because a usage of Pb is becoming prohibited as an environmental protection measure of the recent years, Pb-free substitute solders are being developed to replace said conventional solders. The melting point of an eutectic solder of Sn and Pb is 183° C., and the melting point of an Sn/Ag/Cu solder that is a conventional substitute solder is 219° C. When soldering is done on a resin substrate, because the heat resistance of resin is low, the melting point of a conventional substitute solder can be too high, causing damage to the resin substrate. There has been a demand for a low temperature solder.

As for the characteristics of a substitute solder, naturally it should not contain Pb, and moreover, the metalization temperature should be low, but, in addition, it is desirable that the safety is high, the corrosivity is low, and moreover, that its electrical and thermal conductivities are high. Composite metal nanoparticles of Cu, Ni, Ag and others are being developed as a material meeting this expectation.

Next, nanometal pastes were produced, in which a viscosity imparting agent and a solvent were mixed into these metal nanoparticles. For example, the Japanese Patent Laid-Open No. 2007-297671 has been published as Patent Document 1. In this document, a nanometal paste is suggested, in which the average particle diameter of the primary particles of silver nanoparticles is less than or equal to 200 nm, and a sheet-like structure having remnants of the primary particles of these silver nanoparticles is made to be the metallic component.

The present inventors made nanometal pastes using commercially available silver nanoparticles whose average particle diameter was less than or equal to 200 nm. A diode chip was bonded to a lead frame by said paste to form a diode assembly, and afterwards it was sintered to change the paste layer into a metal layer, thus forming a resin mold body. VF test (electrical conductivity test) and ΔVF test (thermal conductivity test) of this resin mold body were done. On the other hand, a similar resin mold body is made by means of a lead high content solder, and VF test and ΔVF test were done. As a result, it was found that the resin mold body bonded with the composite nanosilver paste showed lower properties in the VF test (electrical conductivity test) and the ΔVF test (thermal conductivity test), in comparison with the resin mold body in which the high lead content solder was used. That is to say, it became clear that by the silver nanoparticle paste of Patent Document 1, the performance fell in terms of the electric/thermal data, in comparison with the lead content solder. In particular, in an electronic component used under a high temperature, even higher electrical and thermal conductivities are required, and it became clear that it absolutely cannot be achieved by the conventional nanometal paste.

To realize higher electrical and thermal conductivities than conventional lead high content solders, an improvement of silver nanoparticles is necessary. Usually, for nanoparticles to fit into the definition, the particle diameter of said silver nanoparticles must be less than or equal to 100 nm. The average particle diameter of said silver nanoparticles is 200 nm, and they have a flaw that they are too large to be a metallic component. Moreover, because such silver nanoparticles mutually aggregate easily, it is estimated that the silver nanoparticles aggregated mutually and became large lump-like silver particles in the previously described nanometal paste, and as a result, even when it was fired, many gaps were caused in the bonding metal layer, and the bond strength deteriorated. To prevent aggregation, silver nanoparticles that can be monodispersed in an organic solvent must be used, and for this, they need to be composite silver nanoparticles in which an organic coating layer is formed circumferentially. The reason is because organic coating layers repel mutually, and therefore composite silver nanoparticles are stable in solvent, and they monodisperse. Therefore, to begin with, the present inventor started to develop composite silver nanoparticles.

The present inventors searched, and as a result, it was found that Patent Documents 2-8 shown subsequently are publicly known as patent documents concerning composite metal nanoparticles, and by correcting the flaws in these publicly known documents, the present invention was completed.

The Japanese Patent Bulletin No. 3205793 (Japanese Patent Laid-Open No. 10-183207) was published as Patent Document 2. Silver organic compounds (particularly, silver organic complexes) were chosen as starting materials. Under the inert gas atmosphere from which air was blocked, said silver organic compound was heated at a temperature greater than or equal to the decomposition start temperature and below the complete decomposition temperature, and composite silver nanoparticles were manufactured, in which the organics originating from said silver organic compound were made to be the coating layer around the circumference of silver cores that had been decomposed and reduced. This preparation method is a solid-gas reaction. The particle diameter of the silver cores is 1-100 nm, and therefore they are referred to as composite silver nanoparticles. Specifically, when 100 g of solid silver stearate was put in a flask under nitrogen gas stream, and heated at 250° C. for 4 hours, composite silver nanoparticles having an organic coating layer of stearate group around the circumference of a silver core with 5 nm particle diameter were produced.

Because in said manufacturing method, a solid body of silver stearate is heated without a solvent, the produced composite silver nanoparticles are difficult to disperse, and there is a flaw that a large number of composite silver nanoparticles become large secondary particles that are bonded in a lump-like state. Moreover, the production temperature is high, namely 250° C., and it can be seen that the metalization temperature of the composite silver nanoparticles is extremely high, namely 220° C. Silver nanoparticles whose production temperature is high also have a high silverization temperature. The melting point of an eutectic Sn—Pb solder is 183° C., and considering that the desired metalization temperature of composite silver nanoparticles is less than or equal to 200° C., said metalization temperature (silverization temperature) is too high at 220° C., and it is difficult to use them as a substitute low-temperature solder. It is thought that the high metalization temperature is caused by the very large particles in a lump-like state, and also by the high decomposition temperature of the stearate group. Moreover, the inventors have confirmed that said silver core is not a single crystal, but simply an atom aggregate or a polycrystal. When the silver cores are polycrystals or disordered, electronic and heat scatterings are caused at a large number of grain boundary surfaces, and as a result, it becomes a cause for lowering of the electric and heat conductivities.

Next, Japanese Patent Laid-Open No. 2003-342605 bulletin was published as Patent Document 3. Said Patent Document 3 is an invention in which one of the present inventors participated in as an inventor. A metal organic compound was dissolved or dispersed in an organic solvent or water, and successfully produced composite silver nanoparticles coated with the organics originating from said metal organic compound. This preparation method is a solid-liquid reaction. Moreover, when this composite silver nanoparticles were observed under a high resolution transmission electron microscope, lattice images were observed on the silver cores, and it was confirmed that they were single crystal silver cores. It is thought that, based on the solid-liquid reaction method, the metal organic compound dissolved and dispersed into the solvent as molecules, said molecules were reduced to precipitate silver atoms, and they became single crystals through recombination between the silver atoms. That is to say, it is thought that the single crystal characteristics are caused by intermolecular reaction. Because the silver cores are single crystals, they have an advantage that the electric and heat conductivities are high. However, as for the silverization temperature, it is written in [0076] that the composite silver nanoparticles with stearate coating were heated at 250° C. for 10 minutes. In other words, a weak point of Patent Document 3 is that the silverization temperature is very high at 250° C. A reason the silverization temperature is high is that the decomposition temperature of the carboxylates that comprise the coating layer is high, for they start from silver organic compounds such as silver acetate, silver hexanoate, and silver octanoate, among others. A further measure is needed to make the metalization temperature less than or equal to 200° C.

Thus, the WO00/076699 bulletin was published as Patent Document 4. One of the present inventors is one of the inventors of this international application publication. Multiple inventions are disclosed in this publication, but among them, a method for processing a metal inorganic compound by means of a surfactant was disclosed for the first time, and a pathway was opened for using a metal inorganic compound as the starting material. That is to say, it consists of the first step, where an ultra-fine particle precursor is formed by making a colloid out of a metal inorganic compound in an nonaqueous solvent by means of surfactant, and the second step, where a reducing agent is added to this colloidal solution, and said ultra-fine particle precursor is reduced, generating composite metal nanoparticles on which a surfactant shell is formed as a coating layer around the circumference of a metal core.

Because a metal inorganic compound is dissolved in a nonaqueous solvent in said method, it has a characteristic that the produced composite metal nanoparticles disperse within the nonaqueous solvent, and therefore it is difficult for them to be in a lump-like state. However, the embodiments disclose copper oleate, silver abietate, silver acetate, nickel oleate, diethyl hexane indium, copper acetate, and silver stearate, and only organometallic compounds are put into use. Moreover, it was found that the metalization temperature of the composite silver nanoparticles produced from silver stearate was high, at 220° C. A further measure to make the metalization temperature less than or equal to 200° C. is need. To make it have even higher characteristics than Sn—Pb eutectic solders, even further effort is required for making the metalization temperature less than or equal to 150° C. Moreover, because a determination of the single crystallinity/polycrystallinity of the silver cores was not made in Patent Document 4, the quality of the electrical and thermal conductivities of the composite metal nanoparticles cannot be determined.

Under the above circumstance, the WO01/070435 bulletin was published as Patent Document 5. This international application publication discloses composite metal nanoparticles in which a coating layer is formed, comprising of organic compounds with carbon number of 4 or higher and including alcohol hydroxyl group, around the circumference of a metal core with 1-100 nm particle diameter that is obtained from a metal salt. Moreover, as an organic compound including a functional group with an adsorptive property, a higher alcohol whose carbon number is greater than or equal to 6 is described.

Furthermore, the WO2005/075132 bulletin was published as Patent Document 6. This publication discloses composite metal nanoparticles whose central part comprises a metal core, and having around it a coating layer of organics whose thermal desorption start temperature is greater than or equal to 140° C. and less than 190° C. As the manufacturing method, it is described that an inorganic metal salt is made to coexist with an organic material, the inorganic metal salt disintegrates, metal cores are formed, and composite metal nanoparticles are produced, in which coating layers of organic matter is formed around the circumference of said metal cores. Also, composite metal nanoparticles are disclosed, in which a coating layer of organic matter is formed around the circumference of an inorganic metal salt or an inorganic metal compound produced by decomposition.

The Japanese Patent Laid-Open No. 2007-95510 bulletin has been published as Patent Document 7. In Claim 1 of Patent Document 7, an electroconductive paste is disclosed, comprising composite metal nanoparticles composed of metallic cores consisting of a metal component originating from a metal salt expressed by a chemical formula of $(R-A)_n$-M, organic coating layers originating from said metal salt, and an organic solvent. R is a hydrocarbon group of carbon number 4-9, A is $COO$, $OSO_3$, $SO_3$, or $OPO_3$, and M is a silver, gold or platinum group. Therefore, composite silver nanoparticles are included.

The Japanese Patent Laid-Open No. 2004-107728 bulletin is disclosed as Patent Document 8. In Claim 1 of Patent Document 8, composite metal nanoparticles are described, that contains organic coating layers whose main components are C, H and O are placed in the circumference of metal cores with an average particle diameter of less than or equal to 100 nm. It is described that these organic coating layers are produced from an organic acid metal salt.

[Patent Document 1] Japanese Patent Laid-Open No. 2007-297671 bulletin
[Patent Document 2] Japanese Patent No. 3205793 (Japanese Patent Laid-Open No. 10-183207 bulletin)
[Patent Document 3] Japanese Patent Laid-Open No. 2003-342605 bulletin
[Patent Document 4] WO00/076699 bulletin
[Patent Document 5] WO01/070435 bulletin
[Patent Document 6] WO2005/075132 bulletin
[Patent Document 7] Japanese Patent Laid-Open No. 2007-95510 bulletin
[Patent Document 8] Japanese Patent Laid-Open No. 2004-107728 bulletin

DISCLOSURE OF THE INVENTION

Problems to be Solved by the Invention

As explained previously, in Patent Document 1, conditions to form a compact metal film having high electrical and thermal conductivities, upon firing a nanometal paste layer, is not disclosed at all. Thus, the present inventors made nanometal pastes according to a conventional paste manufacture procedure. That is to say, they are pastes, obtained by kneading silver nanoparticles with an average particle diameter of 200 nm described in Patent Document 1, with a viscosity imparting agent and a solvent. Just as already stated above, this paste has lower electrical and thermal conductivities than a conventional lead high content solder. As a result of having considered the reasons, the following can be conceived. First, when a large number of uniform spheres of 200 nm are sintered to make them continuous, innumerable gaps remain between the particles, the area of contact becomes relatively small, and as a result, the bond strength between the particles becomes small. Second, the nanometal particles of 200 nm do not monodisperse naturally, but instead they aggregate mutually to form lump-like particles. There are innumerable gaps in the lump-like particles, and these gaps persist even after sintering. Moreover, these gaps are not uniform gaps, but instead are innumerable gaps with a size variation between large and small, and they cause a decrease in the area of contact between the particles. It is thought that this idea of filling these gaps is missing in Patent Document 1.

To fill the above gaps, the present inventors found that when it contains two types of metallic component particles of large and small sizes, it shows an extremely compact sintering behavior when the large and small particles have specific particle diameter conditions. Furthermore, it was found that it has even more compact sintering behavior when the mixing proportion of the large and small particles is within a particular range, and the present invention was led to completion. It was confirmed that a compact metal film having high electrical and thermal conductivity can be realized by a nanometal paste having such composite metal nanoparticles, and the present invention was completed.

Moreover, as the above composite metal nanoparticles, composite metal nanoparticles in which metalization is possible at a low temperature of less than or equal to 200° C. were developed, and these composite metal nanoparticles for low temperature firing was applied to the nanometal paste of the present invention. Such technical concept is not described in Patent Document 1, and it is not even suggested either. To confirm the importance of the above composite metal nanoparticles, comparisons with Patent Documents 5-8 are made for explanation.

In Patent Document 5, it is described that if in composite silver nanoparticles of a particle diameter of 5-10 nm the decomposition temperature of the organic compound is less than or equal to 80° C., the silver coating film formation temperature becomes 80° C., and that if the decomposition temperature is greater than or equal to 80° C., a silver coating film can be formed if they are heated up to that decomposition temperature. However, said statements only are a wishful observation, and such example is not mentioned in the embodiments at all. In the following, it will be explained specifically.

In Embodiment 1, it is described that when copper formate and 1-decanol (C number of 10) are reacted, the solution changes color from around 185° C. and composite copper nanoparticles are formed, and that the copperization firing temperature is 200-350° C., preferably 250-300° C. In Embodiment 2, it is described that composite silver nanoparticles were formed from silver carbonate and myristic acid (C number of 14) at 230° C. by a color change of the solution, and a silver coating film is formed at 250° C. by firing under air. In Embodiment 3, it is confirmed by a change in the solution color that composite silver nanoparticles are produced from silver carbonate and stearyl alcohol (C number of 18) by application of heat at 150° C. for 1 hour, but the silverization temperature under nitrogen atmosphere is described as 250° C. In Embodiment 4, it is confirmed by a change in the solution color that composite silver nanoparticles are produced from silver carbonate and phenol (C number of 6) by application of heat at 180° C. for 1 hour, and the silverization temperature is described as 300° C. In Embodiment 5, it is confirmed by a change in the solution color that composite copper nanoparticles are produced from copper acetate and lauryl alcohol (C number of 12) by application of heat at 100° C. for 1 hour, but the copperization temperature under an atmosphere of hydrogenated nitrogen was 250° C.

Furthermore, in Embodiment 6, it is confirmed by a change in the solution color that composite platinum nanoparticles were produced from platinum chloride and ethylene glycol (C number of 2) by application of heat at 180° C. for 1 hour, but the heat-treatment temperature was 300° C. In Embodiment 7, it is confirmed by a change in the solution color that composite copper nanoparticles were produced from copper acetate and lauryl alcohol (C number of 12) at 110° C., but the copperization temperature under nitrogen atmosphere was 300° C. Lastly, in Embodiment 8, it is confirmed by a change in the solution color that composite copper nanoparticles were produced from copper acetate and ethanol (C number of 2) and a nonionic surfactant (sorbitan tristearate) at 150° C., but the copperization temperature under nitrogen atmosphere was 300° C.

As described above, in the eight embodiments of Patent Document 5, merely a metal core having an organic coating layer with the C number of 14 or more is described, and moreover, the metalization temperature is high, namely greater than or equal to 200° C. Because the carbon number is 14 or greater, the molecular weight becomes large, the weight of the organic coating layer increases relative to the silver core weight, the amount of the exhaust gas at the time of firing increases by the increased quantity of the organic component, and the applicability as a paste decreases. Moreover, the metalization temperatures of all of the composite silver nanoparticles considerably exceed 200° C., and composite metal nanoparticles realizing the desired metalization temperature of less than or equal to 200° C. has not been produced. Therefore, it is clear that they are unsuitable as a substitute solder. That is to say, composite silver nanoparticles that can be used in the present invention must be composite silver nanoparticles that can realize a metalization at less than or equal to 200° C., even more preferably at less than or equal to 150° C. The only one that realizes this is the composite silver nanoparticles having an organic coating layer of alcohol origin that some of the present inventors developed. That is to say, it is composite silver nanoparticles having organic coating layer consisting of an alcohol molecule derivative with carbon number of 1-12, alcohol molecule residues, or one or more types of alcohol molecule. However, the fact is that, in said prior documents, such composite silver nanoparticles are not described nor suggested.

A matter that is impossible to understand is mentioned in Patent Document 6. It is described that when an inorganic metal salt and an organic substance are made to coexist, a coating layer of organic matter is formed in the circumference of a central core that includes an inorganic metal salt or a decomposed inorganic metal compound. For example, in Page 6, it is described that when a mixture of silver carbonate (inorganic metal salt) and myristyl alcohol (organic substance, C number of 14) are reacted at 120° C. for 2 hours, composite silver nanoparticles are formed in which an organic matter is physically adsorbed to silver or silver carbonate. It is clear from the following reaction equation that when an organic matter adheres around the circumference of silver carbonate, the thermolysis temperature for precipitating silver from silver carbonate becomes greater than 400° C.

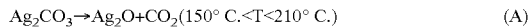

$$Ag_2CO_3 \rightarrow Ag_2O + CO_2 \text{ (150° C.} < T < 210° \text{ C.)} \quad \text{(A)}$$

$$Ag_2O \rightarrow 2Ag + 1/2 O_2 \text{ (T} > 400° \text{ C.)} \quad \text{(B)}$$

At first, the reaction of Equation (A) occurs, but the decomposition temperature in Equation (B) is greater than or equal to 400° C., and a metalization at less than or equal to 200° C. cannot be achieved, and it is also unsuitable as a substitute for Sn—Pb eutectic solders with melting point of 183° C. Moreover, the crystallinity of the silver cores is not described at all, and a determination of the quality of the electrical and thermal conductivities is completely impossible. Also, myristyl alcohol has the C number of 14 and thus a high molecular weight, and so it causes a shortcoming that the weight of the organic coating layer with respect to the silver core increases, and firing temperature becomes high, and at the same time, the amount of the exhaust gas at the time of firing increases, and a large quantity of voids occurs at the time of the bonding, thus decreasing the adequacy as a paste for bonding.

In the composite metal nanoparticles of Patent Document 7, metal cores and organic coating layers are formed as the decomposition products after decomposing a metal salt, and they are different from the present invention in that the start from an organometallic compound. The present invention forms the silver cores from silver carbonate, and the organic coating layers from alcohol, and therefore the manufacturing methods are completely different. Moreover, the organic coating layers are a bound group between a hydrocarbon group and COO, $OSO_3$, $SO_3$, or $OPO_3$, and therefore the structure is complicated and the decomposition temperature is high. In particular, because it includes sulfur S, SOX, which is an air pollution component, is generated by firing, and therefore it does not meet the environmental standard. As described in [0018], even if they can achieve a metalization temperature of around 150° C., they are composite metal nanoparticles that it is impossible to carry out. Also, they have a shortcoming that they contain S and phosphorous P that are unsuitable for semiconductor bonding, and they cannot be used for semiconductor bonding because of a possibility that S and P diffuses into the semiconductor at the time of the bonding. Moreover, the crystallinity of the silver cores is not described at all, and a determination of the quality of the electrical and thermal conductivities is completely impossible.

Because in the composite metal nanoparticles of Patent Document 8, organic coating layer is formed by decomposing an organic acid metal salt, the organic coating layers are an organic acid group, and the volatilization temperature becomes considerably high. It is mentioned in [0031] that the melting point is 210° C., and it is mentioned in [0068] that they are fired in a temperature range of 210-250° C. Therefore, a metalization at 200° C. or below, preferably at 150° C. or below, that the present invention is aimed at, cannot possibly be realized by Patent Document 8. Moreover, a determination of the quality of the electrical and thermal conductivities is completely impossible.

The present invention was done in view of the above problems. First, to form a compact metal layer that shows higher electrical and thermal conductivities than a conventional high lead content solder, the metallic components of the nanometal paste is composed of metallic components whose average particle diameters are large and small, that is to say, from small particles and large particles. The gaps between the large particles can be filled densely with the small particles when, in terms of the average diameters, the diameter of the small particles have a particular relation with the diameter of the large particles. A compact metal layer with few gaps is formed after sintering, and, as a result, high electrical and thermal conductivities have been achieved. More specifically, said two metallic component type composite nanometal paste contains, as metal components, two components of composite metal nanoparticles on which an organic coating layer is formed at a circumference of a metal core with an average particle diameter of d (nm), and metal filler particles with an average particle diameter of D (nm); it has a first relation of d<D, and a second relation of d<100 (nm); and when said organic coating layer volatilizes so that a metal layer is formed by sintering, the size relation between said average particle diameters d, D is set so that said composite metal nanoparticle can be embedded in a hollow four pocket formed when it is assumed that four said metal filler particles are placed so that they come in contact with a tetrahedron. When these are achieved, said composite metal nanoparticles and said metal filler particles sinter compactly. The present invention was completed by this discovery. In particular, the present inventors elucidated for the first time that, as a mathematical relation, said four pocket condition is satisfied when the size relation of said average particle diameters d, D is $0 < d < (\sqrt{3}/\sqrt{2} = 1)D$.

Second, it was clarified that a compact metal layer can be formed, and higher electrical and thermal conductivities than a conventional lead high content solder could be realized, when the mixing proportion of said small and large particles is within a particular range. That is to say, as the lower limit condition, a condition was provided, in which, when composition weight w (wt %) of said composite metal nanoparticles and composition weight W (wt %) of said metal filler particles are defined, a lower limit value of w/(w+W) is set to k times the volume ratio of said four pocket with respect to a volume of a tetrahedron formed by centers of four said metal filler particles that are placed so that they come into contact, where k is within a range of $0 < k \leq 1$. Also, as the upper limit condition, a condition was clarified, in which, when four said metal filler particles are separated mutually so that an enlarged tetrahedron is formed by said centers of four said metal filler particles, and composition weight w (wt %) of said composite metal nanoparticle and composition weight W (wt %) of said metal filler particle are defined, the upper limit value of w/(w+W) is decided by a condition in which another metal filler particle cannot be inserted from an outside of said enlarged tetrahedron into its four pocket. These lower and upper limit conditions were clarified for the first time by the present invention.

Furthermore, with the present invention, alcohol-originating organic coating-type composite metal nanoparticles are used, in which the metal core mass has considerably increased from the conventional nanoparticles because the C number is small, and metalization temperature T3 is made to be lower than 200° C. when thermally analyzed at temperature increase rate VT=1° C./min. As a metal, noble metals such as Au, Pt, Ag, Pd, Rh, Ru, Os, Ir, and base metals such as Cu, Ni can be used. It became clear that if, in particular, Ag (silver) is used, low-priced, stable composite metal nanoparticles could be provided. Because said alcohol-originating organic coating layer comprises one or more types among an alcohol molecule derivative, an alcohol molecule residue, and an alcohol molecule, only $H_2O$ and $CO_2$ are generated when fired, and the environmental standards are completely met. Moreover, because it metalizes at 200° C. or less, it can be used as a substitute for Pb—Sn eutectic solders. Moreover, composite silver nanoparticles that can be fired at a low temperature, in which the mutual relation of decomposition start temperature T1 and decomposition temperature T2 when thermally analyzed at a temperature increase rate VT=1° C./min is limited within a range of T2−100≦T1≦T2, and also satisfy an inequality of T1<T2<T3, can be used. Because production temperature PT (° C.) of such composite silver nanoparticles can be made lower than metalization temperature T3, a composite nanometal paste using composite silver nanoparticles satisfying PT≦T3≦200° C. can be provided. A method of bonding, in which electronic components are bonded by means of this composite nanometal paste, has been established. Furthermore, as described above, because specifically the alcohol-originating material is an alcohol derivative, an alcohol residue, or an alcohol molecule, and only $H_2O$ and $CO_2$ are generated upon firing, it has superior environmental characteristics, and can be effectively applied to bonding of electronic components such as semiconductors. Among the alcohol derivatives, carboxylic acids, carboxylates, alkoxides, and alkoxide groups are included, and compounds in general that are derived from alcohols by chemical reaction are included.

Means to Solve the Problems

The present invention was done to solve the above problems, and the first embodiment of the present invention is a two metallic component type composite nanometal paste, wherein said two metallic component type composite nanometal paste contains, as metal components, two components of a composite metal nanoparticle on which an organic coating layer is formed at a circumference of a metal core with an average particle diameter of d (nm), and a metal filler particle with an average particle diameter of D (nm); it has a first relation of d<D, and a second relation of d<100 (nm); and when said organic coating layer volatilizes so that a metal layer is formed by sintering, the size relation between said average particle diameters d, D is set so that said composite metal nanoparticle can be embedded in a hollow four pocket formed when it is assumed that four said metal filler particles are placed so that they come in contact with a tetrahedron, where said composite metal nanoparticle and said metal filler particle sinter compactly.

The second embodiment of the present invention is a two metallic component type composite nanometal paste, wherein said size relation of said average particle diameters d, D is $0<d<(\sqrt{3}/\sqrt{2}-1)D$.

The third embodiment of the present invention is a two metallic component type composite nanometal paste, wherein, when composition weight w (wt %) of said composite metal nanoparticle and composition weight W (wt %) of said metal filler particle are defined, a lower limit value of w/(w+W) is set to k times a volume ratio of said four pocket with respect to a volume of a tetrahedron formed by centers of four said metal filler particles that are placed so that they come into contact, where k is within a range of 0<k≦1.

The fourth embodiment of the present invention is a two metallic component type composite nanometal paste, wherein a lower limit value of said w/(w+W) is set to a value of $k\{1-3\sqrt{2}\cos^{-1}(1/3)+\pi\sqrt{2}\}$.

The fifth embodiment of the present invention is a two metallic component type composite nanometal paste, wherein a value of said k is chosen within a range of 0.45≦k≦1.

The sixth embodiment of the present invention is a two metallic component type composite nanometal paste, wherein, when four said metal filler particles are separated mutually so that an enlarged tetrahedron is formed by said centers of four said metal filler particles, and composition weight w (wt %) of said composite metal nanoparticle and composition weight W (wt %) of said metal filler particle are defined, an upper limit value of w/(w+W) is decided by a condition in which another metal filler particle cannot be inserted from an outside of said enlarged tetrahedron into its four pocket.

The seventh embodiment of the present invention is a two metallic component type composite nanometal paste, wherein, when in said enlarged tetrahedron, an average particle diameter of said metal filler particle is defined as R, a separation distance between said metal filler particles is defined as 2Δ, Δ/R=x, and a value of x is set at 0<x≦1, an upper limit value of said w/(w+W) is set to a value of $1-3\sqrt{2}\{\cos^{-1}(1/3)-\pi/3\}/(1+x)^3$.

The eighth embodiment of the present invention is a two metallic component type composite nanometal paste, wherein, when composition weight w (wt %) of said composite metal nanoparticle and composition weight W (wt %) of said metal filler particle are defined, a value of w/(w+W) is adjusted within a range of 0.10-0.90.

The ninth embodiment of the present invention is a two metallic component type composite nanometal paste, wherein a solvent and/or a viscosity imparting agent has bee added to it.

The tenth embodiment of the present invention is a two metallic component type composite nanometal paste, wherein paste metalization temperature Tp3 (° C.) is less than or equal to 300° C., when said composite nanometal paste is thermally analyzed under atmosphere at temperature increase rate VT=1° C./min.

The eleventh embodiment of the present invention is a two metallic component type composite nanometal paste, wherein paste metalization temperature Tp3(VT) satisfies Tp3(VT)<Tp3(1° C./min)+100, where a unit of temperature is ° C., when said composite nanometal paste is thermally analyzed under atmosphere at temperature increase rate VT=1-20° C./min.

The twelfth embodiment of the present invention is a two metallic component type composite nanometal paste, wherein paste decomposition start temperature Tp1(VT) and paste decomposition temperature Tp2(VT) satisfy Tp2(VT)−100<Tp1(VT)<Tp2(VT), where a unit of temperature is ° C., when said composite nanometal paste is thermally analyzed under atmosphere at temperature increase rate VT=1-20° C./min.

The thirteenth embodiment of the present invention is a two metallic component type composite nanometal paste, wherein, when said composite nanometal paste is thermally analyzed under atmosphere at temperature increase rate VT=1-20° C./min, paste decomposition start temperature Tp1(VT), paste decomposition temperature Tp2(VT), and paste metalization temperature Tp3(VT) increase with an increase of said temperature increase rate VT, while satisfying a relation of Tp1(VT)<Tp2(VT)<Tp3(VT), a unit of temperature being ° C.

The fourteenth embodiment of the present invention is a two metallic component type composite nanometal paste, wherein, when said composite metal nanoparticle is thermally analyzed under atmosphere at temperature increase rate VT (° C./min), a unit of temperature being ° C., so that decomposition start temperature T1(VT), decomposition temperature T2(VT), along with metalization temperature T3(VT) of said composite metal nanoparticle are defined, and said composite nanometal paste is thermally analyzed under atmosphere at temperature increase rate VT (° C./min), so that paste decomposition start temperature Tp1(VT), paste decomposition temperature Tp2(VT), along with paste metalization temperature Tp3(VT) of said composite nanometal paste are defined, one or more of T1(VT)<Tp1(VT)<T1(VT)+100, T2(VT)<Tp2(VT)<T2(VT)+100, T3(VT)<Tp3(VT)<T3(VT)+100 are established.

The fifteenth embodiment of the present invention is a method of bonding, wherein the two metallic component type composite nanometal paste of any one of the first to fourteenth embodiments is provided, a paste layer is formed between a lower body and an upper body by said composite nanometal paste, and said lower body and said upper body are bonded by sintering said paste layer into a metal layer by application of heat.

The sixteenth embodiment of the present invention is a method of bonding, wherein, when said lower body and said upper body are bonded through said metal layer under no-load or load, and under atmosphere or inert gas, an electric resistance at a time of electric current application between said upper body and said lower body, and a heat conduction to said lower body at heating of said upper body, become small in comparison with a case in which said bonding is done with a conventional high lead content solder.

The seventeenth embodiment of the present invention is an electronic component, wherein it was produced by the method of bonding of the fifteenth or sixteenth embodiment.

Effects of the Invention

According to the first form of the present invention, an advantage is provided, in which the metal layer formed when a paste layer is sintered can be formed into a compact metal layer with few gaps, by composing the metallic components of nanometal paste from two types of metallic components of large and small, that is to say, from large particles and small particles; and filling the gaps between the large particles with the small particles. As a result, a metal layer joint having a high electric conductivity, high heat conductivity, and high bond strength becomes possible. In particular, what has been achieved is higher electrical and thermal conductivities than cases in which a bond is formed with a conventional lead high content solder. More specifically, it is composed from composite metal nanoparticles (metal core average particle diameter: d (nm)) that are the small particles, and metal filler particles (metal average particle diameter: D (nm)) that are the large particles, and the particle diameter conditions are set so that the first relation of d<D and the second relation of d<100 (nm) are satisfied. Furthermore, as the third condition, when said organic coating layer volatilizes so that a metal layer is formed by sintering, the size relation between said average particle diameters d, D is set so that said composite metal nanoparticle can be embedded in a hollow four pocket formed when it is assumed that four said metal filler particles are placed so that they come in contact with a tetrahedron. By these three particle diameter conditions, a two metallic component type composite nanometal paste is provided, in which said composite metal nanoparticles and said metal filler particles sinter compactly.

Because composite metal nanoparticles with an average particle diameter of less than or equal to 100 nm have a size distribution around the average particle diameter, there are many small particles (minute particles) that are smaller than the average particle diameter. Because of this, the gaps between the metal filler particles can be filled with the composite metal nanoparticles. When it is put through a firing process, a compact metal layer nearly free of gaps can be realized. This metal layer can become a bonding metal layer for electronic components, semiconductors and such, and it can show good electrical and mechanical characteristics. Because the small particles are composed of composite metal nanoparticles, they monodisperse throughout the whole paste, move and are placed to fill the gaps, and form a compact metal layer upon firing.

According to the second embodiment of the present invention, a two metallic component type composite nanometal paste can be provided, in which said size relation of said average particle diameters d, D is $0<d<(\sqrt{3}/\sqrt{2}-1)D$. In a tetrahedron formed by a mutual contact of four metal filler particles of average particle diameter D, it is proven that the diameter of a sphere inscribed in the four pocket mathematically becomes $(\sqrt{3}/\sqrt{2}-1)D$. Therefore, if the metal core average particle diameter d of the composite metal nanoparticles is smaller than the diameter of the inscribed sphere, a composite metal nanoparticle are embedded into the four pocket, and a binder effect in which the four metal filler particles are mutually bonded is produced reliably. Because minute composite metal nanoparticles smaller than average particle diameter d are distributed in a large number, compactness of the metal layer can be achieved by said four pocket being filled compactly by these minute particles, and good electrical thermal characteristics can be produced.

According to the third embodiment of the present invention, a two metallic component type composite nanometal paste is provided, in which, when composition weight w (wt %) of said composite metal nanoparticle and composition weight W (wt %) of said metal filler particle are defined, a lower limit value of w/(w+W) is set to k times a volume ratio of said four pocket with respect to a volume of a tetrahedron formed by centers of four said metal filler particles that are placed so that they come into contact, where k is within a range of $0<k\leqq1$. In the present embodiment, the lower limit value of the weight ratio of composite metal nanoparticle with respect to the total metal components is provided. The total metal component weight is provided by the total of metal filler particle weight W and composite metal nanoparticle weight w, (W+w), and it signifies that ratio w/(w+W) of composite metal nanoparticle weight w with respect to this total weight (W+w) is adjusted to k times the volume ratio of a four pocket volume with respect to the tetrahedron volume. The tetrahedron volume corresponds to total metal composition weight (w+W), and the four pocket volume corresponds to composite metal nanoparticle weight w that is filled in the four pocket. When k=1, it signifies that composite metal nanoparticles whose weight is sufficient to embed the entire four pocket volume has been added. Therefore, within a range of $0<k\leqq1$, it signifies that, at the maximum, the entire four pocket is filled, and composite metal nanoparticles of a suitable quantity of less than or equal to the total filling has been added. To produce high electrical and thermal conductivities, it is not necessarily true that a complete four pocket filling of k=1 is preferable. Composite metal nanoparticles have to be present between metal filler particles, and in this case, even if the four pocket is slightly vacated, metal filler particles are reliably bonded by composite metal nanoparticles as a binder. Because of this, high thermal conductance with high electrical conduction property can be produced. That is to say, a bonding by interposition between metal filler particles is more important than a complete filling, and it is sufficient that the best electrical and thermal conductivities are realized by an adjustment within a range of $0<k\leq1$. Therefore, while the value of k is decided adequately, the filling quantity of the composite metal nanoparticles is adjusted, and high electrical and thermal conductivities are found experimentally.

According to the fourth embodiment of the present invention, a two metallic component type composite nanometal paste is provided, in which a lower limit value of said w/(w+W) is set to a value of $k\{1-3\sqrt{2} \cos^{-1}(1/3)+\pi\sqrt{2}\}$. $k\{1-3\sqrt{2} \cos^{-1}(1/3)+\pi\sqrt{2}\}$ is the mathematical ratio of the four pocket volume with respect to the total volume of the tetrahedron, and because this value becomes 0.22036 upon evaluation, it may be written as $k\{1-3\sqrt{2} \cos^{-1}(1/3)+\pi\sqrt{2}\}=0.22036k$. Needless to say, the range parameter k is $0<k\leq1$. In other words, the range of $k\{1-3\sqrt{2} \cos^{-1}(1/3)+\pi\sqrt{2}\}$ is distributed over 0-022036, and an appropriate ratio is determined from within this range. In other words, the lower limit value of said w/(w+W) is chosen adequately within a range of 0-0.22036 for each paste, and high electrical and thermal conductivities are realized according to the bonding object. As thus described, an idea to derive the filling factor mathematically, and apply it to the bonding technique, was accomplished for the first time with the present invention.

According to the fifth embodiment of the present invention, a two metallic component type composite nanometal paste is provided, in which a value of said k is chosen within a range of $0.45\leq k\leq1$. From the experimental experience of the present inventors, it has been found that the lower limit value of w/(W+w) is 0.10, and a good bonding can be realized at this value or higher. When the rough estimate value of 0.22036 is assumed to be 0.22, it becomes 0.10/0.22=0.45. Therefore, in this embodiment, the range of $0<k\leq1$ is more specifically limited to $0.45\leq k\leq1$. The range of k shown as $0.45\leq k\leq1$ signifies that 45%-100% filling of four pockets realizes high electrical and thermal conductivities.

According to the sixth embodiment of the present invention, a two metallic component type composite nanometal paste is provided, in which, when four said metal filler particles are separated mutually so that an enlarged tetrahedron is formed by said centers of four said metal filler particles, and composition weight w (wt %) of said composite metal nanoparticle and composition weight W (wt %) of said metal filler particle are defined, an upper limit value of w/(w+W) is decided by a condition in which another metal filler particle cannot be inserted from an outside of said enlarged tetrahedron into its four pocket. In the following, it is necessary to define the upper limit value of w/(w+W) for a condition to form a good bond. From the densest tetrahedron in which four metal filler particles have come in a mutual contact, an enlarged tetrahedron, formed by the four metal filler particles being separated mutually, is considered. A metal filler particle is placed at each of the apexes of the four facets that are equilateral triangles, and the center becomes vacant. If it is assumed that other metal filler particles cannot embed (intrude) into the inside (four pocket) of this enlarged tetrahedron, metal filler particles of average particle diameter D should not be able to pass through the gap at the center of said equilateral triangle. That is to say, the limit, in which the gap at the center of an equilateral triangle of the enlarged tetrahedron forms an aperture with diameter D, becomes the upper limit value of said w/(w+W). By this limit, the four pocket of an enlarged tetrahedron can be filled with only a composite metal nanoparticle.

According to the seventh embodiment of the present invention, a two metallic component type composite nanometal paste is provided, in which, when in said enlarged tetrahedron, an average particle diameter of said metal filler particle is defined as R, a separation distance between said metal filler particles is defined as $2\Delta$, $\Delta/R=x$, and a value of x is set at $0<x\leq1$, an upper limit value of said w/(w+W) is set to a value of $1-3\sqrt{2}\{\cos^{-1}(1/3)-\pi/3\}/(1+x)^3$. When x=0, the upper limit value of said w/(w+W) becomes $1-3\sqrt{2}\{\cos^{-1}(1/3)-\pi/3\}$, and it corresponds to the case of a tetrahedron in which the metal filler particles have come in a mutual contact. That is to say, the value becomes 0.22036. When x=1, it becomes $\Delta=R$, and, from separation distance $2\Delta=2R=D$, it signifies that the gap of the center of the equilateral triangle corresponds to diameter D. Stated another way, the case of x=1 gives the limiting condition in which another metal filler particle cannot intrude into a four pocket of an enlarged tetrahedron from the gap of the center of an equilateral triangle. At the time of x=1, it becomes $1-3\sqrt{2}\{\cos^{-1}(1/3)-\pi/3\}/(1+x)^3=1-3\sqrt{2}\{\cos^{-1}(1/3)-\pi/3\}/2^3=1-0.77963/2^3=0.9025$. In an enlarged tetrahedron, when the ratio of the four pocket volume with respect to the enlarged tetrahedron volume is equal to 0.90, the upper limit is provided in which another metal filler particle cannot intrude into a four pocket of an enlarged tetrahedron from the gap of the center of an equilateral triangle. Because it is $1-3\sqrt{2}\{\cos^{-1}(1/3)-\pi/3\}=0.77963$, it follows that $1-3\sqrt{2}\{\cos^{-1}(1/3)-\pi/3\}/(1+x)^3=1-0.77963/(1+x)^3$, and for an arbitrary x, the four pocket volume ratio can be easily calculated. As thus described, deriving mathematically the filling factor of composite metal nanoparticles in a real metal layer, and thus establishing the bonding technique, was achieved for the first time by the present inventors.

According to the eighth embodiment of the present invention, a two metallic component type composite nanometal paste is provided, in which, when composition weight w (wt %) of said composite metal nanoparticle and composition weight W (wt %) of said metal filler particle are defined, a value of w/(w+W) is adjusted within a range of 0.10-0.90. It was clarified experimentally by the present inventors that when the mix ratio w/(w+W) is within a range of 0.10-0.90, the metal layer possesses high electrical and thermal conductivities. When this range is considered from the filling factor of composite metal nanoparticle, mix ratio w/(w+W)=0.10 signifies that, under a mutual contact of metal filler particles, 45% of a four pocket of a tetrahedron is filled with a composite metal nanoparticle, and mix ratio w/(w+W)=0.90 signifies a state in which metal filler particles placed at apexes of an enlarged tetrahedron are separated by separation distance D(=2 R). Within such a range, when a paste layer is sintered and converted into a metal layer, it becomes possible to realize high electrical and thermal conductivities to an equal degree as, or a greater degree than, a conventional lead content solder.

According to the ninth form of the present invention, a two metallic component type composite nanometal paste, to which a solvent and/or a viscosity imparting agent is added, can be provided. Said solvent is a material that disperses and makes a solution out of two metallic component particles used in the present invention, and for example, alcohol, acetone, toluene, xylene, propanol, ether, petroleum ether, benzene and such can be used. Said viscosity imparting agent is a material that is added to said solution and imparts viscosity so that it becomes easy to apply, and for example, oil of turpentine, terpineol, methyl cellulose, ethyl cellulose, butylal, various terpene derivatives, IBCH (isobornyl cyclohexanol), glycerin, and an alcohol longer than or equal to C14 that is solid at room temperature can be used, among others. For terpene derivative, there are 1,8-terpine monoacetate and 1,8-terpine diacetate. IBCH is rosin-like, glycerin is syrup-like, and an alcohol longer than or equal to C14 has a property to change between solid and liquid states, and are non-fluid at 10° C. When two metallic component particles of the present invention are mixed and dispersed in said non-fluid viscosity imparting agent to form a non-fluid paste, an aggregation between the two metallic component particles does not occur, because the composite silver nanoparticles are fixed in a dispersed state at a low temperature of less than or equal to 10° C. If said non-fluid paste is heated just before use, it becomes fluid and becomes possible to be applied as a paste, so that it can achieve a function as a paste. Also, needless to say, if said solvent is added to said non-fluid paste just before use, it becomes a fluid paste even without heating, so that it can achieve a function as a paste.

In a composite nanometal paste of the present invention, it is desirable that the evaporating temperature or the decomposition temperature of said solvent and/or viscosity imparting agent is as low as possible. Therefore, the firing temperature of a paste is decided not only by the metalization temperature of the composite silver nanoparticle, but it also depends on the evaporating temperature or the decomposition temperature of the solvent and the viscosity imparting agent. Also, it is necessary for it to gasify by evaporation or decomposition through an application of heat, and materials that carbonize and remain are excluded. Also, as usage embodiments, a paste to which only solvent has been added, a paste to which only viscosity imparting agent has been added, and a paste to which both solvent and viscosity imparting agent have been added, can be used.

According to the tenth embodiment of the present invention, a composite nanometal paste can be provided, in which paste metalization temperature Tp3 (° C.) is less than or equal to 300° C. when said composite nanometal paste is thermally analyzed under atmosphere at temperature increase rate VT=1° C./min. When a composite nanometal paste is put through differential thermal analysis (DTA) under atmosphere, the organic coating layer of composite metal nanoparticle is oxidized, heat of reaction is generated, and a large DTA peak is formed. When this DTA peak comprises a single peak, the temperature at which this single peak ends is paste metalization temperature Tp3 (° C.). When said DTA peak comprises multiple peaks, the temperature at which the final peak ends is paste metalization temperature Tp3 (° C.). When the final peak is a steep peak, because there is nearly no difference between the steep peak temperature and its end temperature, either is preferable, but here, it is defined as the final peak temperature. From the point of view of thermogravimetry (TG), the decrease end temperature of a TG curve corresponds to said paste metalization temperature Tp3 (° C.). According to the present invention, because said paste metalization temperature Tp3 is less than or equal to 300° C., it becomes possible for the composite nanometal paste to undergo a firing at a low temperature. If temperature increase rate VT at the time of a DTA measurement becomes large, said temperature Tp3 increases, but in the present invention, paste metalization temperature Tp3(° C.) as measured at VT=1° C./min is less than or equal to 300° C.

The composite nanometal paste of the present invention contains composite metal nanoparticles whose metalization temperature T3 is T3≦200° C. when measured at 1° C./min, and as a result, as a whole of the paste, it became possible to set paste metalization temperature Tp3(° C.) at 1° C./min to 300° C. or less. Because paste metalization temperature Tp3 is less than or equal to 300° C. at 1° C./min, the cost of manufacturing apparatuses and production facilities can also be largely reduced. Therefore, the composite silver nanopaste of the present invention could be applied to various uses such as electronic materials such as bond materials, printed wiring, and electroconductive materials; magnetic materials such as magnetic storage media, electromagnetic wave absorbers, and electromagnetic wave resonators; structural materials such as far infrared materials and composite coating formation materials; ceramic or metallic materials such as sintering aids and coating materials; and medical materials.

According to the eleventh embodiment of the present invention, a composite nanometal paste can be provided, in which paste metalization temperature Tp3 (VT) satisfies Tp3 (VT)<Tp3(1° C./min)+100, where a unit of temperature is ° C., when said composite nanometal paste is thermally analyzed under atmosphere at temperature increase rate VT=1-20° C./min. The eleventh embodiment signifies that even if temperature increase rate VT is varied within 1-20° C./min, paste metalization temperature Tp3(VT) does not increase to 100° C. more than paste metalization temperature Tp3(1° C./min) at 1° C./min. Because it is Tp3(1° C./min)<300° C. from the tenth embodiment, it is clear that Tp3(VT)<400° C. according to the present invention. As thus described, by being able to set paste metalization temperature Tp3 (VT) low, it becomes possible to sinter a paste layer into a metal layer by a low temperature firing. By using composite metal nanoparticles whose paste metalization temperature Tp3 (1° C./min) is as low as possible, a low temperature firing becomes possible. In particular, if the composite silver nanoparticles that are developed by the present inventors are used, this low temperature firing can be realized.

According to the twelfth embodiment of the present invention, a composite nanometal paste can be provided, in which paste metalization temperature Tp3 (VT) satisfies Tp3(VT) <Tp3(1° C./min)+100, where a unit of temperature is ° C., when said composite nanometal paste is thermally analyzed under atmosphere at temperature increase rate VT=1-20° C./min. Said paste decomposition start temperature Tp1(VT) can be measured with the decrease start temperature of a TG curve, but, when a TG curve decreases linearly from the beginning and then departs from the straight line and decreases in a quadratic curve, the variation point, that is to say, the departure point from the straight line, can be defined as paste decomposition start temperature Tp1(VT). The straight line region can be understood as the decrease region of a pure alcohol component. When a differential curve of a TG curve, that is to say, a DTG curve is used, the temperature in which the DTG curve begins to fall from a constant value may be defined as paste decomposition start temperature Tp1 (VT). Paste decomposition temperature Tp2 (VT), in which the organic coating layer strongly degrades oxidatively, is defined by the DTA peak temperature when the DTA peak is a single peak, and by the earliest peak temperature when the DTA peak is a multiple peak. Whether or not this earliest peak gives the greatest peak depends from material to material. The inequality of Tp2(VT)−100<Tp1(VT)<Tp2(VT) signifies that within a range of temperature increase rate VT=1-20° C./min, paste decomposition start temperature Tp1 (VT) occurs beneath and within an extent of 100° C. It is one of the characteristics of the composite nanometal paste concerning the present invention.

According to the thirteenth embodiment of the present invention, a composite nanometal paste can be provided, in which, when said composite nanometal paste is thermally analyzed under atmosphere at temperature increase rate VT=1-20° C./min, paste decomposition start temperature Tp1(VT), paste decomposition temperature Tp2(VT), and paste metalization temperature Tp3(VT) increase with an increase of said temperature increase rate VT, while satisfying a relation of Tp1(VT)<Tp2(VT)<Tp3 (VT), a unit of temperature being ° C. The definitions of paste decomposition start temperature Tp1(VT), paste decomposition temperature Tp2(VT), and paste metalization temperature Tp3 (VT) of composite nanometal paste of the present invention correspond to the definitions of decomposition start temperature T1(VT), decomposition temperature T2(VT), and metalization temperature T3(VT) of the composite silver nanoparticle of the present invention. However, in a composite nanometal paste of the present invention, a solvent and a viscosity imparting agent are added into composite silver nanoparticles of small particles, and because of this, before the composite silver nanoparticles are oxidatively decomposed, removal and oxidative decomposition of the solvent and the viscosity imparting agent proceed beforehand. Therefore, in a TG and DTA curves, the curves for the solvent and the viscosity imparting agent precede, and then the curve of the composite silver nanoparticles follows. In other words, the first sudden decrease that appears in the TG curve forms the first deep valley in the DTG curve that is its differential curve, and the temperature in which this valley recovers, and the DTG curve becomes approximately 0, can be determined to be paste decomposition start temperature Tp1(VT). This Tp1(VT) gives the second decrease start temperature of the DT curve. After this paste decomposition start temperature Tp1(VT), a DTA peak appears in the DTA curve, and the first DTA peak temperature that appears at the beginning is paste decomposition temperature Tp2(VT). The steep final peak that appears at the end of the DTA peak is thought to be a release peak of the bond energy, in which the remaining uncovered silver cores bond together after the organic coating layer is oxidatively decomposed. This point in which the peak dips down for the last time and bends toward the horizontal direction is defined as paste metalization temperature Tp3 (VT). These paste temperature satisfies an inequality of Tp1 (VT)<Tp2(VT)<Tp3(VT) with a range of temperature increase rate VT=1-20° C./min. Therefore, Tp2(VT)-100<Tp1(VT)<Tp2(VT)<Tp3 (VT) is established when combined with the twelfth embodiment. While satisfying this inequality, as VT increases, Tp1(VT), Tp2(VT), Tp3(VT) also increase. Needless to say, these temperature increments depend upon the carbon number of the organic coating layer, and also, it is thought that they depend upon the silver core particle diameter to some extent.

According to the fourteenth embodiment of the present invention, a composite nanometal paste can be provided, in which said composite metal nanoparticle is thermally analyzed under atmosphere at temperature increase rate VT (° C./min), a unit of temperature being ° C., so that decomposition start temperature T1(VT), decomposition temperature T2(VT), along with metalization temperature T3(VT) of said composite metal nanoparticle are defined, and said composite nanometal paste is thermally analyzed under atmosphere at temperature increase rate VT (° C./min), so that when paste decomposition start temperature Tp1(VT), paste decomposition temperature Tp2(VT), along with paste metalization temperature Tp3(VT) of said composite nanometal paste are defined, one or more of T1(VT)<Tp1(VT)<T (VT)+100, T2(VT)<Tp2(VT)<T2(VT)+100, T3(VT)<Tp3(VT)<T3 (VT)+100 are established. According to the studies of the present inventors, it was found that between T1, T2, T3 of composite silver nanoparticles (notated CnAgAL, n=1-12) and Tp1, Tp2, Tp3 of a composite nanometal paste (notated PCnAgAL, n=1-12), the following inequalities were approximately satisfied within a range of temperature increase rate VT=1-20(° C./min).

$$T1(VT)<Tp1(VT)<T1(VT)+100 \quad (P7)$$

$$T2(VT)<Tp2(VT)<T2(VT)+100 \quad (P8)$$

$$T3(VT)<Tp3(VT)<T3(VT)+100 \quad (P9)$$

Through these inequalities, and by means of measuring characteristic temperatures T1, T2, T3 of the composite silver nanoparticles, characteristic temperatures Tp1, Tp2, Tp3 of the composite nanometal paste can be estimated.

According to the fifteenth embodiment of the present invention, a method of bonding is provided, in which the composite nanometal paste of any one of the first to fourteenth embodiments is provided, a paste layer is formed between a lower body and an upper body by said composite nanometal paste, and said lower body and said upper body are bonded by sintering said paste layer into a metal layer by application of heat. This embodiment is a method of bonding of two objects by the use of a composite nanometal paste. One object is termed a lower body, and the other object an upper body. Both are adhered through a paste layer then fired, and by conversion of the paste layer into a metal layer, a strong bonding can be achieved. Moreover, a metal film has a superior electrical conductivity, thermal conductivity, and bond strength, and because a low temperature firing is possible, a bonding between low melting objects also becomes possible.

According to the sixteenth embodiment of the present invention, a method of bonding is provided, in which, when said lower body and said upper body are bonded through said metal layer under no-load or load, and under atmosphere or inert gas, an electric resistance at a time of electric current application between said upper body and said lower body, and a heat conduction to said lower body at heating of said upper body, become small in comparison with a case in which said bonding is done with a conventional high lead content solder. According to studies of the present inventor, it was determined that when bonded bodies are subjected to various tests of functioning under high temperature environment, low temperature environment, and long duration, durability can be provided, and they would endure a repetition performance test, if the electric resistance at the time of electric current application between said upper body and said lower body, and the heat conduction to said lower body at heating of said upper body, become small in comparison with a case in which said bonding is done with a conventional high lead content solder. It became clear that, when bonding tests are done using the composite nanometal paste of the present invention, the electrical and thermal conductivity exceeds a case in which a conventional lead high content solder has been used. Therefore, it became clear that high electrical and thermal conductivities could be provided by the present invention.

According to the seventeenth embodiment of the present invention, an electronic component produced by the method of bonding of the fifteenth or sixteenth embodiment can be provided. Because an electronic component provided by this embodiment has a high electrical conductivity, a high thermal conductivity, and a high bond strength, it has a long service life, and a normal operation can be done stably even under a severe environment.

BRIEF DESCRIPTION OF THE DRAWINGS

FIG. 1 is an explanatory diagram of the first step of a low temperature production reaction of the composite silver nanoparticles concerning the present invention.

FIG. 2 is an explanatory diagram of the second step of a low temperature production reaction of composite silver nanoparticles concerning the present invention.

FIG. 7 is a figure of mutual relations of characteristic temperatures T1, T2, T3 of composite silver nanoparticles concerning the present invention.

FIG. 8 is a particle diameter relation figure of the three metallic components of a composite nanometal paste concerning the present invention.

FIG. 9 is a particle diameter condition figure for a metal layer to sinter compactly, in the composite nanometal paste concerning the present invention.

FIG. 12 is an explanation figure of the diameter of an inscribed sphere that is inscribed in a four pocket of the present invention.

FIG. 13 is an explanation figure of the range of average particle diameter d of the metal cores of composite metal nanoparticles filling into four pockets.

FIG. 14 is an explanation figure of the volume ratio of the four pocket volume with respect to the tetrahedron volume.

FIG. 15 is an explanation figure of the calculation of tetrahedron volume.

FIG. 17 is a proof figure of the volume of a four pocket present in the interior of a tetrahedron.

FIG. 18 is a calculation figure of the filling factor of an enlarged four pocket of an enlarged tetrahedron in which the metal filler particles are separated mutually.

FIG. 20 is an explanation figure of the theoretical range of the filling factor of a composite metal nanoparticle into a four pocket.

FIG. 21 is an explanation figure of the elastic minimal filling factor of a composite metal nanoparticle into a four pocket.

FIG. 23 is a characteristic temperature figure of CnAgAL and PCnAgAL concerning the present invention.

FIG. 24 is manufacture process diagram of a diode resin mold body for bonding tests.

FIG. 25 is a test measurement diagram of VF and ΔVF of a diode resin mold body.

BEST MODE FOR CARRYING OUT THE INVENTION

Figure 3:
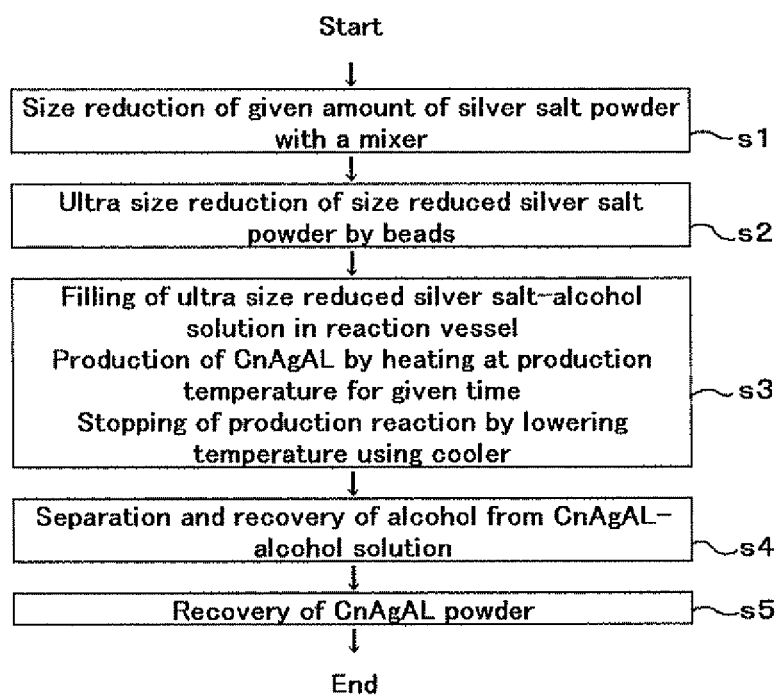
FIG. 3 is a flow diagram showing a low temperature production procedure of composite silver nanoparticles concerning the present invention.

In the following, embodiments of the composite silver nanoparticles, the manufacturing method, the composite nanometal paste, and the method of bonding concerning the present invention are explained in detail by figures and tables.

FIG. 1 is an explanatory diagram of the first step of a low temperature production reaction of the composite silver nanoparticles concerning the present invention. The inorganic compound to be a raw material is a silver compound (1). When a silver salt, including silver oxide, is used as the silver compound, an inorganic silver salt and an organic silver salt can be used. As for inorganic silver salts, there are silver carbonate, silver chloride, silver nitrate, silver phosphate, silver sulfate, silver borate, and silver fluoride among others. Also, as for organic silver salts, there are fatty acid salts such as silver formate and silver acetate, silver sulfonate, and silver salts of hydroxy group, thiol group, and enol group, among others. Among these silver salts, silver salts comprising C, H, O, Ag, a silver salt comprising C, H, Ag, silver salts comprising H, O, Ag, silver salts comprising C, O, Ag, and silver salts comprising O, Ag are preferable in that they do not contain impurities. The reason is that, even when the silver salt is mixed as an impurity into generated composite silver nanoparticles, only $H_2O$, $CO_2$, $O_2$ and such are generated by the firing. In the embodiment of the present invention, silver carbonate $Ag_2CO_3$ is described below as a suitable silver salt, but, needless to say, other silver salts can be used similarly.

As for the alcohol, an alcohol shown in Equation (2) is used. $R_n$ of Equation (3) indicates the hydrocarbon group of the alcohol. Carbon number n is limited to 1-12. Normally, silver salt particles are insoluble in alcohol, but the hydrophilic group OH of alcohol has a property that it bonds easily with the surface of silver salt particles. Also, the hydrophobic group $R_n$ of alcohol has a high affinity with an alcohol solvent. Therefore, as shown in Equation (4), when silver salt particles are dispersed in an alcohol solvent, the alcohol adsorbs on the silver salt particle surface as to surround it, and they are suspended in the alcohol solution. When the particle diameter of silver salt particles is small, a stable silver salt particle colloid is formed. On the other hand, a precipitate can be formed when the particle diameter of silver salt particles is large, but this will not be a problem if the suspended condition is maintained for a few tens of minutes, and also, it may be reacted while stirred slowly.

FIG. 2 an explanatory figure of the second step of a low temperature production reaction of composite silver nanoparticles concerning the present invention. In here, to make the reaction equation clear, silver carbonate is used in the explanation as the example of a silver salt, but it is similar even in cases of other silver salts. The silver carbonate of the silver carbonate particle surface reacts with the alcohol, and as shown in Equation (5), aldehyde $R_{n-1}CHO$ is produced simultaneously with the silverization. Also, as shown in Equation (6), a reaction path also exists, in which silver alkoxide $AgOR_n$ is generated directly without an aldehyde being formed. Said aldehyde has a strong reduction effect, and as shown in Equation (7), it reduces silver carbonate, and carboxylic acid $R_{n-1}COOH$ is formed simultaneously with the silverization. The intermediately produced Ag, $AgOR_n$, and $R_{n-1}COOH$ aggregate mutually by the reactions shown in Equation (8) and Equation (9), and composite silver nanoparticles are produced, in which the interior is Ag, and an alcohol originating organic coating layer such as alkoxide or carboxylate is provided on the surface. As composite silver nanoparticles, $Ag_{k+m}(OR_n)_m$, $Ag_{k+m}(OR_n)_m R_{n-1}COOH$ are produced. These composite silver nanoparticles are illustrated in Equations (10) and (11). Said reactions are surface reactions of the silver carbonate particles, and the reactions continue while gradually seeping from the surface to the inside, the silver carbonate particles that are central cores changing into silver cores. Ultimately, composite silver nanoparticles shown in Equations (10) and (11) are produced.

Equations (10) and (11) show constitutive formulas of the formed organic coating layer on the silver cores and their circumferences. Organic coating layer can be an alkoxide group $OR_n$, or can be a carboxylic acid $R_{n-1}COOH$. Of course, it can be a carboxylate group $R_{n-1}COO$ from which an H has detached from a carboxylic acid (fatty acid). Therefore, the organic coating layer can be an alkoxide, an alkoxide group, a carboxylic acid, a carboxylate group, or a mixed form thereof.

Table 1 shows the types, their mass, and the mole ratios of the excess alcohol solutions of the raw materials (silver carbonate and alcohol) for composite silver nanoparticles. Also, Table 2 shows the molecular weights of the raw materials for composite silver nanoparticles, and the mole number per 100 g. In correspondence with the carbon number, (the C number) n, the individual nomenclatures of the alcohol are shown. Embodiment 1 described below corresponds to n=1, Embodiment 2 to n=2, Embodiment 3 to n=3, Embodiment 4 to n=4, Embodiment 5 to n=5, Embodiment 6 to n=6, Embodiment 7 to n=7, Embodiment 8 to Embodiment 9 to n=9, Embodiment 10 to n=10, Embodiment 11 to n=11, and Embodiment 12 to n=12.

As shown in previous Equation (6), in a gas reaction of silver carbonate and alcohol, the stoichiometric ratio is silver carbonate:alcohol=1 mol:2 mol. However, as shown in table 1, in the present invention, silver carbonate has to be dispersed into to an excess alcohol. This is to decrease the collision probability of the composite silver nanoparticles produced, and prevent an aggregation of the composite silver nanoparticles. As shown in table 1, in Embodiments 1 to 12, the mole ratio is set to a range of alcohol mole number/silver carbonate mole number=15.0 to 95.8, and made to be an excess alcohol solution. Because this mole ratio becomes more optimal as it increases, it can be raised to mole ratio=10 to about 200. Even silver salts other than silver carbonate are adjusted to excess alcohol solution. Tables 1 and 2 are as follows.

FIG. 3 is a flow diagram showing a low temperature production procedure of composite silver nanoparticles concerning the present invention. In Step s=1, a commercial silver salt of specified quantity is size-reduced with a mixer. Even though average particle diameter of commercial silver salt is 10 μm, the variation is extremely large. In Step s=2, the size-reduced silver salt powder is ultra size-reduced with beads, so that it is made uniform with an approximate particle diameter of 10 nm. The relation with the beads particle diameter and the silver salt ultra size-reduced particle diameter is described below in Table 3. In Step s=3, the ultra size-reduced silver salt is dispersed in an alcohol of excess amount. This alcohol solution is filled in a reactor, and composite silver nanoparticles (CnAgAL) are produced by heating only up to a predetermined time (reaction time) at a production temperature (reaction temperature). After the time elapse, the production reaction is stopped by promptly lowering the temperature with a cooler. In Step s=4, the alcohol is separated and collected from CnAgAL alcohol solution, and the CnAgAL powder is collected in Step s=5.

TABLE 1

Mass of Raw Materials of Composite Silver Nanoparticles (Silver Carbonate and Alcohol) and Mole Ratio of Excess Alcohol Solutions

| No. | Number of Carbons | Ag2CO3 Mass | Ag2CO3 Mole Number | Alcohol Raw Material | Alcohol Mass | Alcohol Mole Number | Mole Ratio | Denotation of Composite Nanosilver Particles |
|---|---|---|---|---|---|---|---|---|
| Embodiment 1 | 1 | 100 g | 0.383 mol | CH3OH | 174 g | 5.45 mol | 15.0 | C1AgAL |
| Embodiment 2 | 2 | 100 g | 0.363 mol | C2H5OH | 250 g | 5.45 mol | 15.0 | C2AgAL |
| Embodiment 3 | 3 | 100 g | 0.363 mol | C3H7OH | 1309 g | 21.78 mol | 60.9 | C3AgAL |
| Embodiment 4 | 4 | 100 g | 0.363 mol | C4H9OH | 403 g | 5.45 mol | 15.0 | C4AgAL |
| Embodiment 5 | 5 | 100 g | 0.363 mol | C5H11OH | 1920 g | 21.78 mol | 60.0 | C5AgAL |
| Embodiment 6 | 6 | 100 g | 0.363 mol | C6H13OH | 3450 g | 34.8 mol | 95.8 | C6AgAL |
| Embodiment 7 | 7 | 100 g | 0.363 mol | C7H15OH | 3795 g | 32.67 mol | 90.0 | C7AgAL |
| Embodiment 8 | 8 | 100 g | 0.363 mol | C8H17OH | 1320 g | 10.2 mol | 28.1 | C8AgAL |
| Embodiment 9 | 9 | 100 g | 0.363 mol | C9H19OH | 4713 g | 32.67 mol | 90.0 | C9AgAL |
| Embodiment 10 | 10 | 100 g | 0.363 mol | C10H21OH | 3300 g | 21.0 mol | 57.9 | C10AgAL |
| Embodiment 11 | 11 | 100 g | 0.363 mol | C11H23OH | 5630 g | 32.67 mol | 90.0 | C11AgAL |
| Embodiment 12 | 12 | 100 g | 0.363 mol | C12H25OH | 1680 g | 9.0 mol | 24.8 | C12AgAL |

TABLE 2

Molecular Weight of Raw Materials for Composite Nanosilver Particles

| Number of Carbon C | Name of Raw Material | Raw Material | Molecular Weight | Mole Number Per 100 g |
|---|---|---|---|---|
| | Silver Carbonate | Ag2CO3 | 275.744 | 0.363 |
| 1 | Methanol | CH3OH | 32.042 | 3.121 |
| 2 | Ethanol | C2H5OH | 46.069 | 2.171 |
| 3 | Propanol | C3H7OH | 60.096 | 1.664 |
| 4 | Butanol | C4H9OH | 74.123 | 1.349 |
| 5 | Pentanol | C5H11OH | 88.150 | 1.134 |
| 6 | Hexanol | C6H13OH | 102.177 | 0.979 |
| 7 | Heptanol | C7H15OH | 116.203 | 0.861 |
| 8 | Octanol | C8H17OH | 130.230 | 0.768 |
| 9 | Nonanol | C9H19OH | 144.257 | 0.693 |
| 10 | Decanol | C10H21OH | 158.284 | 0.632 |
| 11 | Undecanol | C11H23OH | 172.311 | 0.580 |
| 12 | Dodecanol | C12H25OH | 186.338 | 0.537 |

Table 3 is a relation table between the beads particle diameter and the ultra size-reduced particle diameter of the silver salt including $Ag_2CO_3$. The smaller the beads particle diameter is, the smaller becomes the ultra size-reduced particle diameter, and the particle diameter of CnAgAL produced by the previous also becomes smaller. The beads particle diameters of 1 mm-0.03 mm exist, and thus the ultra size-reduced particle diameter can be controlled freely to a range of 5000 nm-10 nm.

TABLE 3

| Beads diameter (mm) | Circumvolution time (min) | Particle diameter of ultra size-reduced silver salt (nm) |
|---|---|---|
| 0.03 | 5 | 10 |
| 0.05 | 5 | 50 |
| 0.1 | 5 | 200 |

TABLE 3-continued

| Beads diameter (mm) | Circumvolution time (min) | Particle diameter of ultra size-reduced silver salt (nm) |
|---|---|---|
| 0.2 | 5 | 800 |
| 0.5 | 5 | 2000 |
| 1 | 5 | 5000 |

Particle diameter of raw material silver salt: 10 μm, with size distribution
Particle diameter of silver salt size-reduced through a mixer: uniform 10 μm
Ultra size-reduction treatment of size-reduced silver salt by beads
Circular movement through 2000 rpm revolution and 800 rpm rotation

Embodiments 1-12

C1AgAL-C12AgAL

Table 4 is a list of the production conditions (reaction conditions) of composite silver nanoparticles C1AgAL-C12AgAL of C1-C12 and the particle structures. As the carbon number increases from C1 to C12, the production time is shortened from 237 minutes to 18 minutes, and conversely, the production temperature increases from 40° C. to 149° C. Also the average particle diameter X (nm) of the metal core decreases from 52 to 11, and the average particle diameter X shows a tendency to become larger as the C number becomes smaller. The particle size distribution tends to become smaller as the C number increases, but even at the maximum distribution, it was smaller than 100 nm. The maximum of the distribution becomes smaller when the production time is made shorter. Furthermore, metal content percentage becomes smaller as the C number increases, but even at the minimum, it shows a high value of 91.3%. This signifies that the organic matter content percentage conversely increases with the C number. What is particularly remarkable is the fact that, for example, even if the metal core average particle diameter of C1AgAL is X=52 nm, the distribution is distributed broadly to 11-92 nm, and considerably small ultrafine particles smaller than average particle diameter are contained in a large quantity. In the present invention, as previously described, the range of the average particle diameter was decided by the four pocket condition. However, because ultrafine particles considerably smaller than the average particle diameter exist in large quantities, a group of these ultrafine particles is embedded into the small gaps of four pockets, and it becomes a reason that a metal layer formed by sintering is made compact. These conditions are facts common to all composite silver nanoparticles.

TABLE 4

Production Conditions and Particle Constants of Composite Silver Nanoparticles

| No. | C Number | Production Time | Production Temperature PT | Metal Core Average Particle Diameter X | Metal Core Particle Diameter Distribution | Metal Content Percentage | Organic Content Percentage |
|---|---|---|---|---|---|---|---|
| Embodiment 1 | 1 | 237(分) | 40(° C.) | 52 (nm) | 11~92 (nm) | 98.1(%) | 1.9(%) |
| Embodiment 2 | 2 | 198 | 72 | 47 | 9.7~85 | 97.2 | 2.8 |
| Embodiment 3 | 3 | 143 | 91 | 45 | 6.6~81 | 96.5 | 3.5 |
| Embodiment 4 | 4 | 92 | 97 | 38 | 5.0~74 | 95.9 | 4.1 |
| Embodiment 5 | 5 | 52 | 106 | 34 | 4.2~67 | 95.2 | 4.8 |
| Embodiment 6 | 6 | 39 | 110 | 31 | 3.3~65 | 94.7 | 5.3 |
| Embodiment 7 | 7 | 36 | 135 | 26 | 3.1~56 | 94.2 | 5.8 |
| Embodiment 8 | 8 | 29 | 142 | 22 | 3.0~50 | 93.6 | 6.4 |
| Embodiment 9 | 9 | 26 | 113 | 20 | 3.0~45 | 93.0 | 7.0 |
| Embodiment 10 | 10 | 24 | 139 | 18 | 2.8~34 | 92.4 | 7.6 |
| Embodiment 11 | 11 | 21 | 143 | 14 | 2.1~27 | 91.8 | 8.2 |
| Embodiment 12 | 12 | 18 | 149 | 11 | 1.9~20 | 91.3 | 8.7 |

Figure 4:
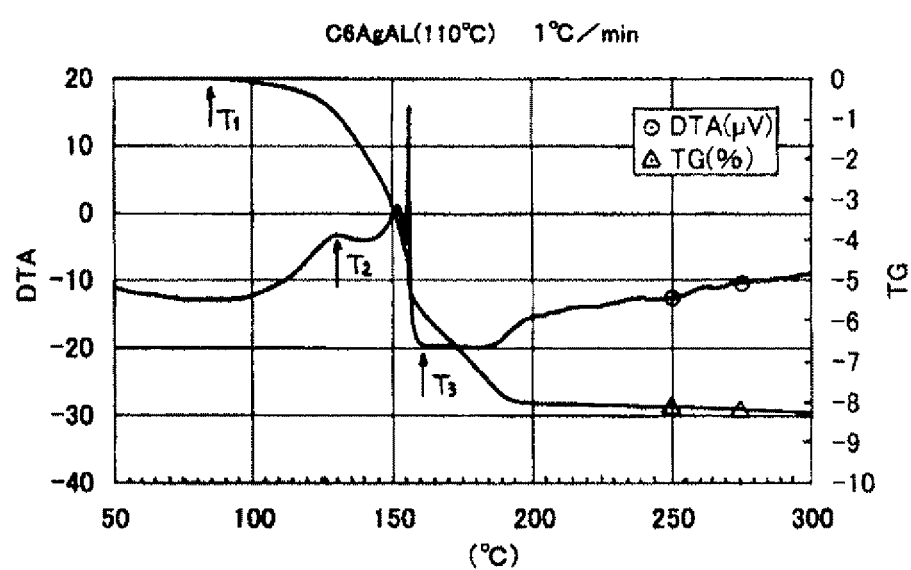
FIG. 4 is a thermal analysis graph of C6AgAL produced at 110° C. concerning the present invention (temperature increase rate: 1° C./min).

FIG. 4 is a thermal analysis graph in which C6AgAL (Embodiment 6) produced at 110° C. is thermally analyzed at a temperature increase rate of 1° C./min. T1 indicates the decomposition start temperature, T2 the metalization temperature (silverization temperature), and T3 the decomposition temperature. Decomposition start temperature T1 is defined by the TG decrease start temperature, but it can also be defined by the DTA increase start temperature. Decomposition temperature T2 is defined by the earliest peak temperature (first peak temperature). There are two peaks in this DTA, and because the maximum peak is the second peak, the maximum peak temperature does not necessarily give decomposition temperature T2. The present inventors currently think that the first peak corresponds to the decomposition temperature of minute particles in the composite silver nanoparticles, and the second peak corresponds to the decomposition temperature of larger particles or aggregated particles within the composite silver nanoparticles. Metalization temperature T3 is defined by the end temperature of the last peak, but when the last peak is a steep peak, defining with the steep peak temperature does not cause much difference. This last peak is thought to give the temperature in which the silver cores of said minute particles, large particles, and aggregated particles that have become uncovered move mutually, to form a compact metal layer (silver layer). As a result, T1=95° C., T2=132° C., T3=157° C. were obtained.

Table 5 is a relational table of characteristic temperatures T1, T2, T3, PT of composite silver nanoparticles, alcohol boiling temperature BT, and carbon number. Characteristic temperatures T1, T2, T3 were measured on CnAgAL (n=1-12) of Embodiments 1-12, by doing the same thermal analysis as in FIG. 4, at a temperature increase rate of 1° C./min. Production temperature PT is set at a temperature less than or equal to boiling point BT of the corresponding alcohol. Metalization temperature T3 varies between 117-198° C., but T3≦200° C. is established, and it is shown that the present invention can utilize composite silver nanoparticles that can be fired at low temperature. From this table, it was demonstrated that T1<T2<T3, PT<T3, and T3≦200° C. are established.

FIG. 7 is a figure of mutual relations of characteristic temperatures T1, T2, T3 of composite silver nanoparticles concerning the present invention. Characteristic temperatures T1, T2, T3 obtained in the present invention are summarized. The composite silver nanoparticles obtained in the present invention are C1AgAL-C12AgAL. The following matter became known by thermally analyzed them under atmosphere and measuring TG and DTA curves. Decomposition start temperature T1 (° C.) can be defined by the TG decrease start temperature or the DTA increase start temperature. Decomposition temperature T2 (° C.) is the DTA peak temperature. It is defined with the beginning peak temperature in a case that multiple peaks are comprised, but it may be defined with the DTA maximum peak temperature. Silverization temperature (metalization temperature) T3 (° C.) is defined by the DTA final peak temperature, but it may be defined with the DTA final peak ending temperature, and it is defined as the TG stabilizing temperature from a TG curve. Also, PT (° C.) is the production temperature (reaction temperature) of composite silver nanoparticles.

TABLE 5

Relation between Characteristic Temperatures PT, T1, T2, T3, BT (° C.) of Composite Silver Nanoparticles and Carbon Number
(Temperature Increase Rate: 1° C./min)

| No. | C Number | Production Temperature PT | Decomposition Start Temperature T1 | Decomposition Temperature T2 | Metallization Temperature T3 | Alcohol Boiling Temperature BT |
|---|---|---|---|---|---|---|
| Embodiment 1 | 1 | 40 | 74 | 112 | 121 | 64.7 |
| Embodiment 2 | 2 | 72 | 81 | 128 | 141 | 78.3 |
| Embodiment 3 | 3 | 91 | 95 | 129 | 152 | 97.4 |
| Embodiment 4 | 4 | 97 | 103 | 130 | 174 | 117 |
| Embodiment 5 | 5 | 106 | 97 | 131 | 175 | 137 |
| Embodiment 6 | 6 | 110 | 95 | 132 | 157 | 157 |
| Embodiment 7 | 7 | 135 | 73 | 139 | 180 | 177 |
| Embodiment 8 | 8 | 142 | 83 | 156 | 179 | 185 |
| Embodiment 9 | 9 | 113 | 92 | 164 | 183 | 214 |
| Embodiment 10 | 10 | 139 | 104 | 175 | 189 | 231 |
| Embodiment 11 | 11 | 143 | 93 | 185 | 192 | 243 |
| Embodiment 12 | 12 | 149 | 121 | 189 | 198 | 261 |

Figure 5:
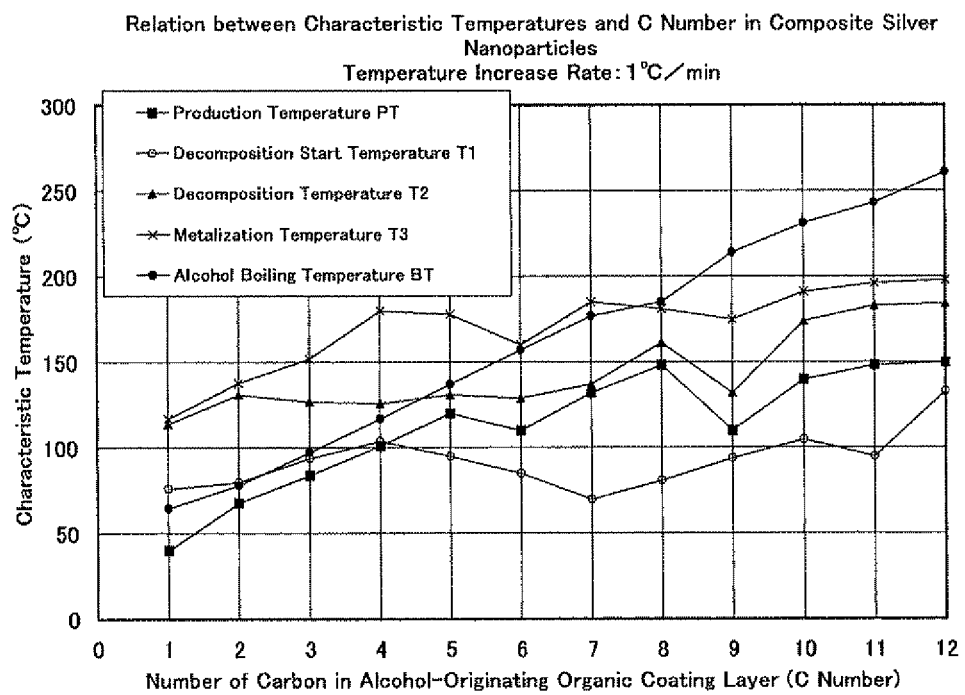
FIG. 5 is a relational graph between characteristic temperatures T1, T2, T3, PT and the C numbers of composite silver nanoparticles concerning the present invention, at a temperature increase rate of 1° C./min.

FIG. 5 is a relational graph between the characteristic temperatures and the C numbers of composite silver nanoparticles. This FIG. 5 is a graphic representation of PT, T1, T2, T3, and BT shown in Table 6 against the C number. Also from this graph, it is shown that T1<T2<T3, PT<T3, and T3≦200° C. are established.

Table 6 is a relational table between the C number and T1 shown in Table 5, and it is a relational table that proves T2−100≦T1≦T2 is established. Its third to fifth rows show the values of T2−100, T1, and T2. Clearly, an inequality of T2−100≦T1≦T2 is established.

TABLE 6

Range of Decomposition Start Temperature T1 of Composite Silver Nanoparticles (Temperature Increase Rate: 1° C./min)
T2 − 100 ≦ T1 ≦ T2

| Embodiment No. | C Number | T2 − 100 (° C.) | Decomposition Start Temperature T1 (° C.) | Decomposition Temperature T2 (° C.) |
|---|---|---|---|---|
| Embodiment 1 | 1 | 12 | 74 | 112 |
| Embodiment 2 | 2 | 28 | 81 | 128 |
| Embodiment 3 | 3 | 29 | 95 | 129 |
| Embodiment 4 | 4 | 30 | 103 | 130 |
| Embodiment 5 | 5 | 31 | 97 | 131 |
| Embodiment 6 | 6 | 32 | 95 | 132 |
| Embodiment 7 | 7 | 39 | 73 | 139 |
| Embodiment 8 | 8 | 56 | 83 | 156 |
| Embodiment 9 | 9 | 64 | 92 | 164 |
| Embodiment 10 | 10 | 75 | 104 | 175 |
| Embodiment 11 | 11 | 85 | 93 | 185 |
| Embodiment 12 | 12 | 89 | 121 | 189 |

Figure 6:
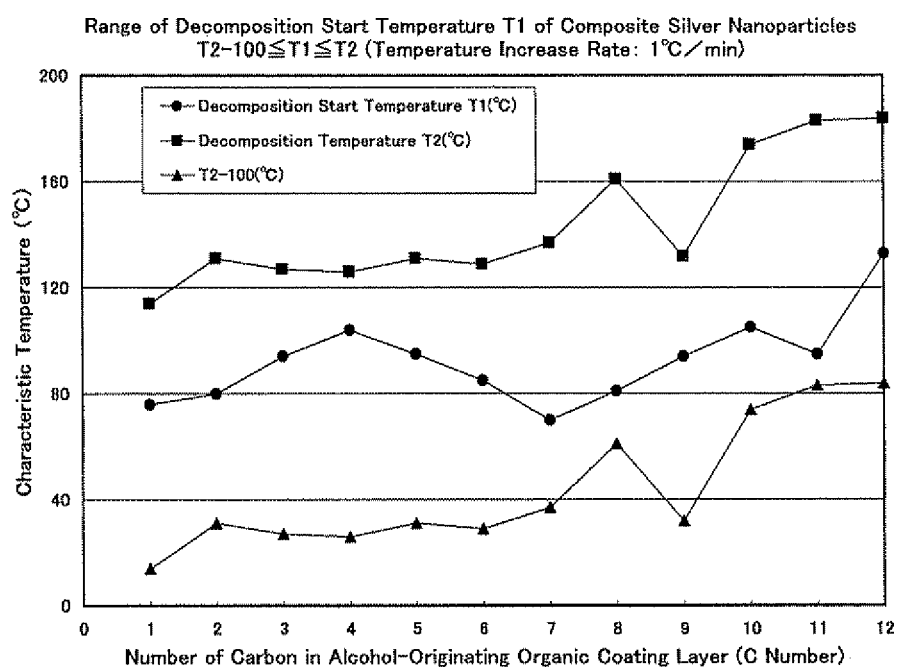
FIG. 6 is a temperature range graph of decomposition start temperature T1 of composite silver nanoparticles concerning the present invention, at a temperature increase rate of 1° C./min.

FIG. 6 is a graphic representation of Table 6, and it is a range figure of decomposition temperature T1 of composite silver nanoparticles. It is illustrated that decomposition start temperature T1 exists beneath decomposition temperature T2, within 100° C. As for numerical formula, a relation of T2−100≦T1≦T2 is proved. This relational equation became first known with the present invention, and the property of the characteristic temperatures of composite silver nanoparticles is provided.

By thermally analyzing at temperature increase rate VT=1° C./min, facts of Equations (C1)-(C4) was obtained. In Equation (C1) it becomes T1<T2<T3, and the decomposition start temperature, the decomposition temperature, and the metalization temperature increase in this order. In Equation (C2) it becomes T2−100<T1<T2, and the decomposition start temperature exists below and within 100° C. of the decomposition temperature. In Equation (C3), T3≦200° C. is established. The silverization temperature (metalization temperature) of composite silver nanoparticles of the present invention is less than or equal to 200° C., and the sintering temperature can be set at a low temperature. Also, because it is PT<T3 in Equation (C4), it is a fact that composite silver nanoparticles can be produced at a reaction temperature less than or equal to the metalization temperature. In the present invention, these facts were obtained. Furthermore, temperature increase rate VT was increased, and relation of equations (C5)-(C7) were confirmed within a range of 1(° C./min) ≦VT≦20(° C./min). In Equation (C5), T1(VT)<T2(VT)<T3(VT) is obtained, and the relation of Equation (C1) is established at an arbitrary temperature increase rate VT. Also, in Equation (C6), T2(VT)−100<T1(VT)<T2(VT) is obtained, and the relation of Equation (C2) is established at an arbitrary temperature increase rate VT. Furthermore, in Equation (C7), T3(VT)<T3(1° C./min)+100 is obtained, and the metalization temperature at an arbitrary temperature increase rate VT does not increase by 100° C. or more than the metalization temperature at VT=1 (° C./min).

FIG. 8 is a particle diameter relation figure of the two metallic components of a composite nanometal paste concerning the present invention. The composite nanometal paste of the present invention is composed of two types of metallic components. The first particles are composite metal nanoparticles NS on which an organic coating layer is formed at the circumference of a metal core of average particle diameter d (nm) (described in Table 4), and these become small particles. The second particles are metal filler particles F of average particle diameter D (nm), and this corresponds to large particles. Commercial silver particles are used. For these large particles and small particles to fill the gaps mutually, particle diameter conditions, first relation of Equation (12), d<D, and the second relation of Equation (13), d<100 nm, are necessary. Generally, 100 nm will be necessary. Furthermore, as the third condition, when four metal filler particles are made to contact mutually, and positioned as a tetrahedron, a gap, which the inventors refer to as a four pocket, exists in the center of the tetrahedron. There exist particular conditions for D and d, by which composite metal nanoparticle NS that is said small particle can be embedded within this four pocket. Because the diameter of inscribed sphere NS max inscribed in the four metal filler particles in said four pocket is $(\sqrt{3}/\sqrt{2}-1)$D, it is necessary for said average particle diameter d to satisfy Equation (15) as an embedding condition. Because it is $(\sqrt{3}/\sqrt{2}-1)$=0.2247, said condition can be expressed by Equation (16). Equations (15) and (16) are equivalent.

FIG. 9 is a particle diameter condition figure for a metal layer to sinter compactly in the present invention. A tetrahedron is composed by four metal filler particles F of average radius R, and more specifically, a tetrahedron whose metal filler particles A, B, C, D form edges of 2R is presumed. Four pocket P is formed in this center, and inscribed sphere NSmax of radius $r_0$ is positioned in this four pocket. Therefore, it is clear that when average radius r is assumed for the metal cores of the composite metal nanoparticles, the condition of Equation (17) becomes an embedding condition.

Figure 10:
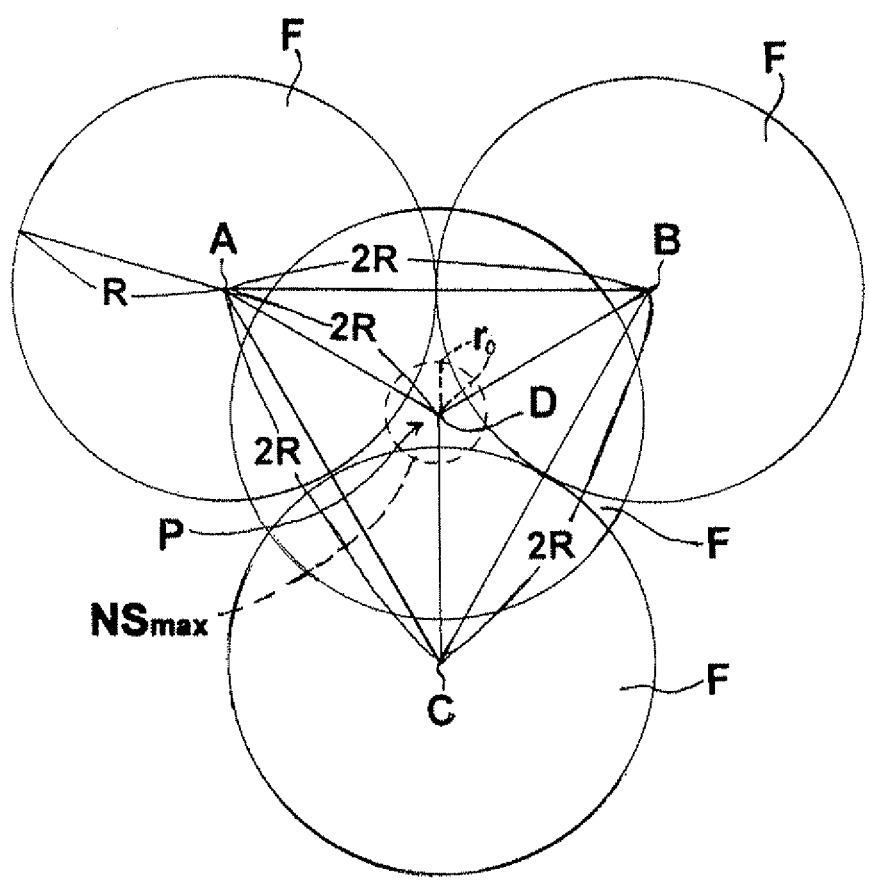
FIG. 10 is a diagram of a four pocket formed at the center of a tetrahedron, in which four metal nanofiller particles are positioned while in contact.

FIG. 10 is a diagram of a four pocket formed at the center of a tetrahedron, in which four metal nanofiller particles are positioned while in contact. In the present invention, the four pocket theory is applied concretely to increase furthermore the filling factor of two kinds of metal particles. That is to say, four metal filler particles F are three-dimensionally placed (three-dimensional closest packing placement) while under contact condition. The gap at the center becomes four pocket P. Inscribed circle NSmax inscribed in four said metal filler particles F is formed in this four pocket P, and radius $r_0$ of this inscribed circle NSmax is determined. If average particle diameter d of metal cores of said composite metal nanoparticles satisfies $d \leq 2r_0$, it is expected that a metal core of a composite metal nanoparticle becomes embedded in four pocket P.

Figure 11:
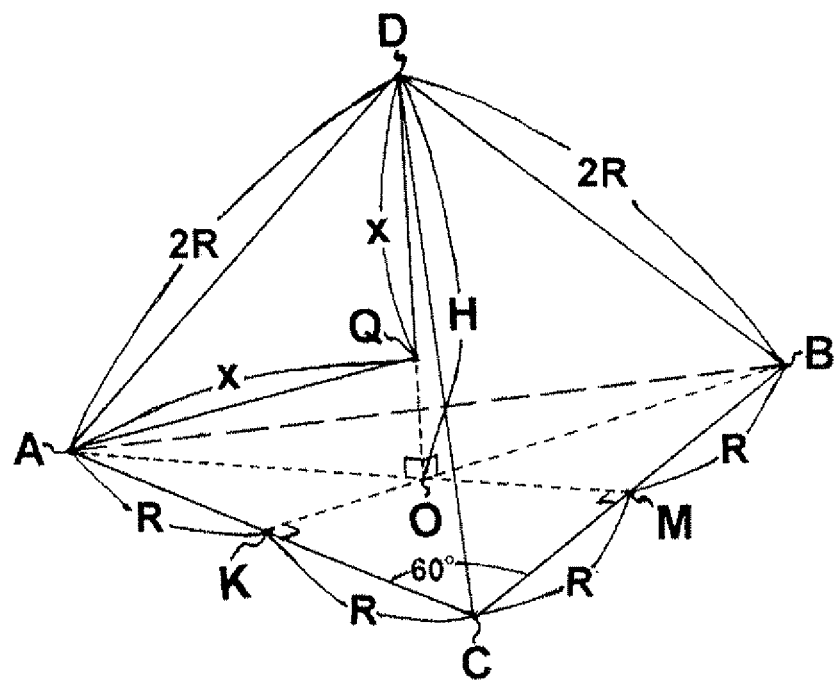
FIG. 11 is a geometrical structural diagram of a tetrahedron of the present invention.

FIG. 11 is a geometrical structural diagram of a tetrahedron of the present invention. Tetrahedron ABCD is formed by centers A, B, C, D of four metal filler particles F. The four faces are all equilateral triangles, and when perpendicular line AO is formed from point D to equilateral triangle ABC, point O coincides with the center of gravity of equilateral triangle ABC. It is assumed that distance between OD=H, and as for the lengths of the lines from point Q on OD to four apexes A, B, C, D, it is assumed that QA=AB=QC=QD=x. This x is determined.

FIG. 12 is an explanation figure of the diameter of an inscribed sphere that is inscribed in a four pocket of the present invention. As seen in Equation (18), said x is the sum of metal filler particle radius R and inscribed sphere radius $r_0$. Because point O is the center of gravity of equilateral triangle ABC, Equation (19) is established, AO=BO becomes ⅔ of line segment AM, and Equation (20) is established. Triangle ODB is a right triangle, and from the Pythagorean theorem, Equation (21) and thus Equation (22) are established. From Equation (22), H is obtained as Equation (23). Also, because triangle AQO too is a right triangle, an Equation (24) is established from the Pythagorean theorem. When the specific equation is substituted, Equations (25) and (26) are obtained, and when this Equation (26) is solved for, said x is obtained as Equation (27). Therefore, by using Equation (18), inscribed sphere radius r0 becomes Equation (28). By the above, it becomes $r_0=(\sqrt{3}/\sqrt{2}-1)$R, and numerically, $r_0$=0.2247R is obtained.

FIG. 13 is an explanation figure of the range of average particle diameter d of the metal cores of composite metal nanoparticles filling into four pockets. Equation (17) is the radius filling condition, and Equation (30), in which the former has been doubled, is the particle diameter filling condition. From $0<d \leq 2r_0$ and Equations (28) and (29), Equations (33) and (34) are established. Ultimately, $0<d \leq (\sqrt{3}/\sqrt{2}-1)$D or $0<d \leq 0.2247$D is the condition in which the metal core of a composite metal nanoparticle can be inserted (embedded) into four pocket P.

Next, the filling factor of a composite metal nanoparticle into four pocket P is considered. When a paste layer is sintered, the organic components of the paste layer are decomposed and volatilized, and the remaining metal components sinter mutually, and convert into a macro-sized metal body. Upon sintering, the previously described tetrahedron converts into a sintered body of metal filler F and the metal core of the composite metal nanoparticle. The volume of the entire tetrahedron corresponds to the total weight (W+w) of metal filler W and metal core w. Also, it is thought that the volume of the four pocket corresponds to the weight of metal core w. Because ratio w/(W+w) of composite metal nanoparticle with respect to total metal weight (W+w) of the metal core weight coincides with ratio $v_0/V_0$ of four pocket volume $v_0$ with respect to tetrahedron volume $V_0$, ratio w/(W+w) is determined in the following as ratio $v_0/V_0$. The lower limit value of ratio w/(W+w) can be calculated from ratio $v_0/V_0$ of the tetrahedron in which metal filler particles have come in a mutual contact, and the upper limit value of ratio w/(W+w) can be calculated from ratio v/V of the enlarged tetrahedron in which metal filler particles have separated mutually. In the following, the lower limit value is determined first.

FIG. 14 is an explanation figure of the volume ratio of the four pocket volume with respect to the tetrahedron volume. The volume of the entire tetrahedron is assumed to be $V_0$, and the volume of the four pocket is assumed to be $v_0$. If it is assumed that the whole of the four pocket is filled with the metal core of the composite metal nanoparticle, the ratio of the composite metal nanoparticle metal content with respect to the total metal content becomes minimum filling factor Xmin, and as shown in Equation (35), it becomes Xmin=$v_0/V_0$. The proof is described below, but $V_0$ is given by Equation (36), and $v_0$ by Equation (37). When the ratio is taken, Xmin=$v_0/V_0$ is obtained as Equations (38) and (39). When Equation (38) is evaluated decimally, it becomes Xmin=0.22036 as shown in Equation (39). That is to say, it has been proved that the volume of the four pocket is approximately 22% of the volume of the tetrahedron. In an ideal state in which gaps completely disappear, it is shown that a considerably compact metal layer can be formed when 22% composite metal nanoparticles and 78% metal fillers are mixed.

FIG. 15 is an explanation figure of the calculation of tetrahedron volume, and a proof of Equation (36) in FIG. 14 is given. Because tetrahedron is a pyramid, the volume is described by Equation (40), by base product×height/3. When FIG. 11 is referred to, the area of triangle ABC becomes Equation (41) by base×height/2. Height H is already given by Equation (23). Therefore, by substituting Equations (41) and (23) into Equation (40), tetrahedron volume $V_0$ is given by Equation (36).

Figure 16:
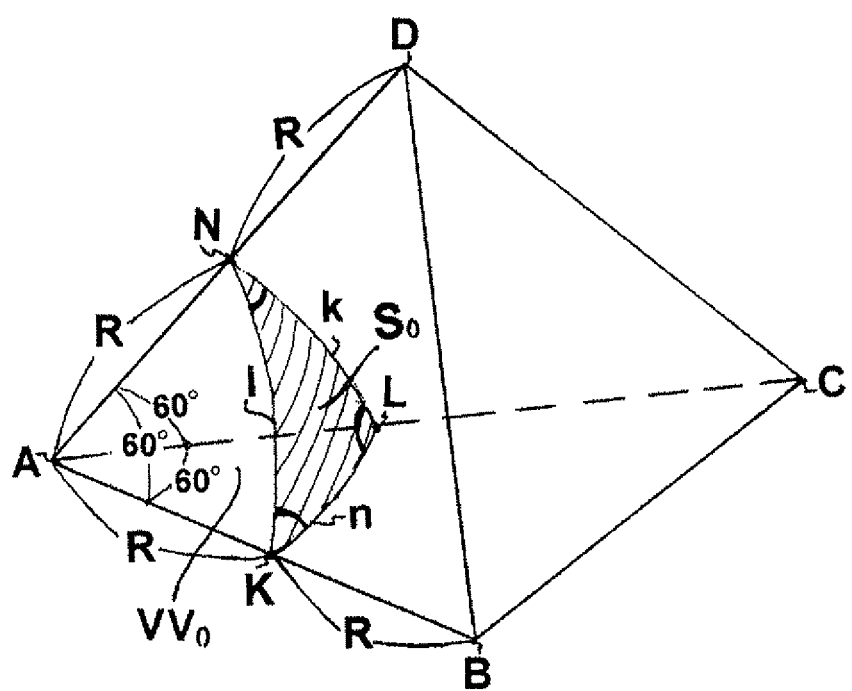
FIG. 16 is a geometric schematic diagram of solid AKLN that is a part of the metal filler particle at an apex of a tetrahedron.

FIG. 16 is a geometric schematic diagram of solid AKLN that is a part of the metal filler particle at an apex of a tetrahedron. Solids AKLN are present in each of apexes A, B, C, D, and each is a part of a sphere of radius R having spherical triangle KLN. Therefore, to determine volume $vv_0$ of solid AKLN, one has to use the spherical trigonometry. Also, If $4 \times vv_0$ is subtracted from volume $V_0$ of the tetrahedron, it is expected that four pocket volume $v_0$ is obtained theoretically.

FIG. 17 is a proof figure of the volume of a four pocket present in the interior of a tetrahedron. Area $S_0$ of spherical triangle KLN can be calculated by Area Equation (42), and as shown by Equation (43), angles k, l, n becomes 60 degrees=$\pi$/3. To determine angles K, L, N, Equation (44) that is a cosine theorem of the spherical trigonometry is used. When k, l, n of Equation (43) is used for substitution, Equations (45) and (46) are established, and K=L=N=$\cos^{-1}$(1/3) is obtained as Equation (47). When Equation (47) is substituted into Equation (42), area $S_0$ is obtained as Equation (48). Because, in a sphere, spherical triangle area $S_0$ and volume $vv_0$ of solid AKLN have a linear relation, Equation (49) is established. That is to say, because area $4\pi R^2$ of the spherical surface corresponds to sphere volume $(4\pi/3)R^3$, Proportional Equation (49) is established. From this, vv0 becomes Equation (50). As shown by Equation (51), the volume of the four solids is $4 \times vv_0$, and Equation (52) is established after all. Therefore, when Equations (36) and (52) are substituted into Equation (53), four pocket volume $v_0$ becomes Equation (54), and Equation (37) is provided by its summarization. From this result, Equations (38) and (39) of FIG. 14 are determined, as previously described.

FIG. 18 is a calculation figure of the filling factor of an enlarged four pocket of an enlarged tetrahedron in which the metal filler particles are separated mutually. The upper limit value of said ratio w/(W+w) can be calculated from ratio v/V of the enlarged tetrahedron in which the metal filler particles have been separated mutually. Therefore, volume V of the enlarged tetrahedron and volume v of the enlarged four pocket are determined, and filling factor X=v/V of Equation (55) is calculated. The enlarged tetrahedron is composed by four metal filler particle F of average radius R being mutually separated by spacing 2Δ. The volume of four metal filler particles at the apexes of the enlarged tetrahedron does not change from the previous, and the four pocket is expanded and transformed into the enlarged four pocket.

The volume of a tetrahedron under mutual contact placement is already calculated by Equation (36). By Equation (56), only through substituting R+Δ for this R, volume V of the enlarged tetrahedron can be derived as V=(2√2/3)(R+Δ)³, just as shown in Equation (57). Volume v of the enlarged four pocket is given as v=V−4$vv_0$, as shown in Equation (58), and when Equation (52) is substituted into 4$vv_0$, Equation (59) can be derived. In here, it is put as Δ=Rx as shown in Equation (60), and radius enlargement ratio x is introduced under a condition of x≧0. Right then, v and v are converted into Equations (61) and (62). Therefore, filling factor X=v/V is calculated as Equation (63) or (64). Specifically, 3√2{$\cos^{-1}$(1/3)−π/3}=0.77963 is used. The range of radius enlargement ratio x becomes important. It is x≧0, and when x=0 is put, it coincides with Equations (38) and (39) for a tetrahedron with contact placement. In the following, the upper limit value of radius enlargement ratio x is decided.

Figure 19:
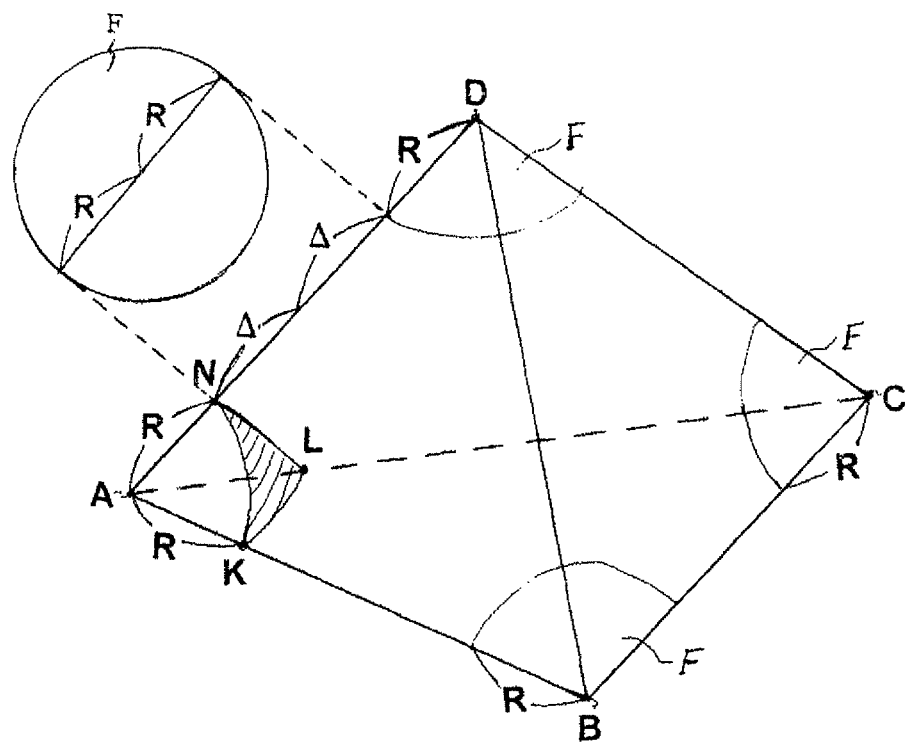
FIG. 19 is a geometrical explanation diagram of an enlarged tetrahedron in which intrusion of another metal filler particle is blocked.

FIG. 19 is a geometrical explanation diagram of an enlarged tetrahedron in which intrusion of another metal filler particle is blocked. When another metal filler particle is to intrude a side of enlarged tetrahedron ABCD, the condition for preventing this intrusion is Δ≦R. That is to say, if the gap of the side is smaller than metal filler particle F, metal filler particle F cannot intrude into the enlarged four pocket. When Equation (60) is used, it becomes x≦1, and when it is combined with x≧0, 0≦x≦1 is obtained.

FIG. 20 is an explanation figure of the theoretical range of the filling factor of a composite metal nanoparticle into a four pocket. Equations (63) and (64) are established under an assumption of an enlarged tetrahedron, that is to say, under a condition of x≧0. When it is assumed x=0 as in Equation (65), the enlarged tetrahedron returns to a tetrahedron of the contact placement type, and Equations (38) and (39) are established, just as already derived. Because the greatest filling is the threshold value in which another metal filler particle does not intrude, it becomes x=1 of Equation (66), and when this is substituted into Equations (63) and (64), Equation (67) is obtained. When this is calculated specifically, it becomes Equation (68). Under this condition, the volume ratio of the enlarged four pocket with respect to the enlarged tetrahedron becomes 0.90254. Filling factor X becomes 0.22036≦X≦0.90254 by Equation (69). In other words, when a four pocket in a contact type tetrahedron is completely filled with a composite metal nanoparticle without a gap, the filling factor becomes 0.22036, and when an enlarged four pocket with one side of 4R (separation distance 2R) is completely filled with a composite metal nanoparticle without a gap, the filling factor becomes 0.90254. That is to say, said mix proportion w/(W+w)=0.22036−0.90254 gives the theoretical range of filling factor X. The upper limit value 0.90 coincides with the experimental empirical rules. However, according to the experimental empirical rules of the present inventors, the lower limit value of the filling factor is allowed down to 0.10, and it exists as secret knowledge of the present inventors that high electrical and thermal conductivities are found at this 0.10. This will be explained next.

FIG. 21 is an explanation figure of the elastic minimal filling factor of a composite metal nanoparticle into a four pocket. It is thought that the cases in which the whole of the four pocket of a contact type tetrahedron is filled with a composite metal nanoparticle without a gap are rare. When observed by electron microscopy, it is often that even when gaps are not completely filled, high electrical and thermal conductivities are present. It is sufficient that metal filler particles are bonded with interposing composite metal nanoparticles, and it is not necessary to fill the four pockets with composite metal nanoparticles without a gap. As the experimental experience value, Xmin=0.10 is appropriate. This signifies it is sufficient that about half of a four pocket is filled, or two inscribed spheres NSmin are embedded into a four pocket. It is analyzed in detail in the following.

Radius $r_0$ of an inscribed sphere is expressed by Equation (28), and as for its volume nv, when it is calculated by means of Equation (70), Equation (71) is obtained. Because volume $V_0$ of a tetrahedron is given by Equation (36), the volume ratio of one inscribed sphere with respect to the tetrahedron becomes Equation (72), and when decimally expressed, it becomes 0.0504 of Equation (73). The volume ratio Xmin with respect to the tetrahedron of four pocket P is 0.22036, as indicated by Equation (39). This value corresponds to 4.3722 times the inscribed sphere. Therefore, because the empirical value 0.10 is about ½ of 0.22036, it signifies that it is sufficient to fill about half of a four pocket. Also, 0.10 is 0.0504×2 of inscribed sphere, and it is thought that it corresponds to two inscribed spheres. There, as shown by Equation (75), it is put as Xmin=0.22036×k, and it becomes Xmin=0.10 when k=0.45. One may interpret that k varies within a range of 1.45% of a four pocket is filled up at k=0.45, and 100% of a four pocket is filled up at k=1. In other words, it signifies that by filling 45% or more of four pockets, high electrical and thermal conductivity can be obtained. Here, from theoretical minimum filling factor Xmin=0.22036, elastic minimum filling factor Xfmin=0.10 of Equation (76) is derived empirically, and the range of filling factor X is assumed to be 0.10≦X≦0.90, as shown in Equation (77).

Table 7 is a numerical particle diameter condition table of two metallic component type composite nanometal pastes. When the average particle diameter of metal filler particles is defined as D (nm), and the metal core average particle diameter of composite metal nanoparticle as d (nm), Equations (12), (13), and (16) are established. When Equations (12) and (16) are used, and when particle diameter D is made to be 100-1000 nm, average particle diameter d (nm) is set so that the inequality relations shown in Table 7 are satisfied. Needless to say, if it is within this numerical range, the four pocket conditions are satisfied. Particle diameter conditions No, when particle diameter D is made to be 100-1000 nm, are as shown in the table. This is used in the tables described below, and they show which four pocket condition is satisfied by the composite nanosilver pastes described below.

TABLE 7

Particle Diameter Conditions of Two Metallic Component Composite Nanometal Paste

| Particle Diameter Condition No. | D (nm) | d (nm) |
|---|---|---|
| ① | 100 | ≦22.4 |
| ② | 200 | ≦44.9 |
| ③ | 300 | ≦67.4 |
| ④ | 400 | ≦89.8 |
| ⑤ | 500 | ≦112 |

TABLE 7-continued

Particle Diameter Conditions of Two Metallic Component Composite Nanometal Paste

| Particle Diameter Condition No. | D (nm) | d (nm) |
|---|---|---|
| ⑥ | 600 | ≦134 |
| ⑦ | 700 | ≦157 |
| ⑧ | 800 | ≦179 |
| ⑨ | 900 | ≦202 |
| ⑩ | 1000 | ≦224 |

Average particle diameter of metal filler particles: D (nm)
Metal core average particle diameter of composite metal nanoparticles: d (nm)
First relation: d < D (nm) (12)
Second relation: d < 100 (nm) (13)
Third relation: d ≦ 0.2247D (nm) (16)

Embodiments 101-603

PC1AgAL-PC6AgAL

Table 8 is a specific composition table of two metallic component composite nanosilver pastes PC1AgAL-PC6AgAL. The composite silver nanoparticles are expressed as CnAgAL, but the two metallic component composite nanosilver paste is expressed as PCnAgAL. The two metallic components are CnAgAL and silver fillers. CnAgAL are composite silver nanoparticles given in Table 4, and weight percents (wt %) and average particle diameters d (nm) of the metal cores are shown. The silver fillers are commercially available silver particles, and percentage by weight W (wt %) and average particle diameter D (nm) are shown. The particle diameter conditions are the particle diameter conditions given in Table 7, and specific four pocket conditions are shown. For the solvent that decreases the viscosity, various solvents can be used, but methanol, ethanol, butanol, xylene, and toluene are used here. Also, for the viscosity imparting agent that increases making the viscosity, various viscosity imparting agents can be used, but oil of turpentine and a terpene derivative are used here. The paste viscosity can be adjusted freely by the ratio between the solvent and the viscosity imparting agent, but here, the solvent is set at 6.0 wt %, and the viscosity imparting agent at 4.0 wt %.

TABLE 8

Compositions of Two Metallic Component Composite Nanosilver Pastes (PC1AgAL~PC6AgAL)

| Embodiment No. | Composite Nanosilver Paste (Expression formula) | CnAgAL wt % | CnAgAL Diam. | Silver Filler wt % | Silver Filler Ave. Diam. | Filling factor w/(w + W) | Particle Diam. Condition | Solvent Type | Solvent (wt %) | Viscosity Imparting Agent Type | Viscosity Imparting Agent (wt %) |
|---|---|---|---|---|---|---|---|---|---|---|---|
| Embodiment 101 | PC1AgAL | 70 wt % | 52 nm | 20 wt % | 300 nm | 77.7% | ③ | Methanol | 6.0 | Oil of Turpentine | 4.0 |
| Embodiment 102 | PC1AgAL | 40 | 52 | 50 | 500 | 44.4 | ⑤ | Methanol | 6.0 | Oil of Turpentine | 4.0 |
| Embodiment 103 | PC1AgAL | 15 | 52 | 75 | 700 | 18.6 | ⑦ | Methanol | 6.0 | Oil of Turpentine | 4.0 |
| Embodiment 201 | PC2AgAL | 70 | 47 | 20 | 300 | 77.7 | ③ | Ethanol | 6.0 | Terpene Derivative | 4.0 |
| Embodiment 202 | PC2AgAL | 40 | 47 | 50 | 500 | 44.4 | ⑤ | Ethanol | 6.0 | Terpene Derivative | 4.0 |
| Embodiment 203 | PC2AgAL | 15 | 47 | 75 | 700 | 16.6 | ⑦ | Ethanol | 6.0 | Terpene Derivative | 4.0 |
| Embodiment 301 | PC3AgAL | 70 | 45 | 20 | 300 | 77.7 | ③ | Xylene | 6.0 | Terpene Derivative | 4.0 |
| Embodiment 302 | PC3AgAL | 40 | 45 | 50 | 500 | 44.4 | ⑤ | Xylene | 6.0 | Terpene Derivative | 4.0 |
| Embodiment 303 | PC3AgAL | 15 | 45 | 75 | 700 | 16.6 | ⑦ | Xylene | 6.0 | Terpene Derivative | 4.0 |
| Embodiment 401 | PC4AgAL | 70 | 38 | 20 | 300 | 77.7 | ③ | Butanol | 6.0 | Oil of Turpentine | 4.0 |
| Embodiment 402 | PC4AgAL | 40 | 38 | 50 | 500 | 44.4 | ⑤ | Butanol | 6.0 | Oil of Turpentine | 4.0 |
| Embodiment 403 | PC4AgAL | 15 | 38 | 75 | 700 | 16.6 | ⑦ | Butanol | 6.0 | Oil of Turpentine | 4.0 |
| Embodiment 501 | PC5AgAL | 70 | 34 | 20 | 300 | 77.7 | ③ | Ethanol | 6.0 | Terpene Derivative | 4.0 |
| Embodiment 502 | PC5AgAL | 40 | 34 | 50 | 500 | 44.4 | ⑤ | Ethanol | 6.0 | Terpene Derivative | 4.0 |
| Embodiment 503 | PC5AgAL | 15 | 34 | 75 | 700 | 16.6 | ⑦ | Ethanol | 6.0 | Terpene Derivative | 4.0 |

TABLE 8-continued

Compositions of Two Metallic Component Composite Nanosilver Pastes (PC1AgAL~PC6AgAL)

| Embodiment No. | Composite Nanosilver Paste (Expression formula) | CnAgAL wt % | CnAgAL Diam. | Silver Filler Ave. wt % | Silver Filler Ave. Diam. | Filling factor w/ (w + W) | Particle Diam. Condition | Solvent Type | Solvent (wt %) | Viscosity Imparting Agent Type | Viscosity Imparting Agent (wt %) |
|---|---|---|---|---|---|---|---|---|---|---|---|
| Embodiment 601 | PC6AgAL | 70 | 31 | 20 | 300 | 77.7 | ③ | Toluene | 6.0 | Oil of Turpentine | 4.0 |
| Embodiment 602 | PC6AgAL | 40 | 31 | 50 | 500 | 44.4 | ⑤ | Toluene | 6.0 | Oil of Turpentine | 4.0 |
| Embodiment 603 | PC6AgAL | 15 | 31 | 75 | 700 | 16.6 | ⑦ | Toluene | 6.0 | Oil of Turpentine | 4.0 |

Embodiments 701-123

PC7AgAL-PC12AgAL

Table 9 is a specific composition table of two metallic component composite nanosilver pastes PC7AgAL-PC12AgAL. The composite silver nanoparticles are expressed as CnAgAL, and the two metallic component composite nanosilver pastes are expressed as PCnAgAL. The two metallic components are CnAgAL and silver filler. CnAgAL are composite silver nanoparticles given in Table 4, and the weight percents (wt %) and average particle diameters d (nm) of the metal cores are shown. The silver nanofillers are large diameter composite silver nanoparticles given in Table 7, and their weight percentages (wt %), average particle diameters d of the metal cores (nm), and C numbers are shown. The silver fillers are commercially available silver particles, and the % by weight (wt %) and average particle diameter D (nm) are shown. The particle diameter conditions are the particle diameter conditions given in Table 7, and specific four pocket conditions are shown. For the solvent that decreases the viscosity, various solvents can be used, but butanol, ethanol, and hexane are used here. Also, for the viscosity imparting agent that increases making the viscosity, various viscosity imparting agents can be used, but oil of turpentine and a terpene derivative are used here. The paste viscosity can be adjusted freely by the ratio between the solvent and the viscosity imparting agent, but here too, the solvent is set at 6.0 wt %, and the viscosity imparting agent at 4.0 wt %.

TABLE 9

Compositions of Two Metallic Component Composite Nanosilver Pastes (PC7AgAL~PC12AgAL)

| Embodiment No. | Composite Nanosilver Paste (Expression formula) | CnAgAL wt % | CnAgAL Diam. | Silver Filler Ave. wt % | Silver Filler Ave. Diam. | Filling factor w/ (w + W) | Particle Diam. Condition | Solvent Type | Solvent (wt %) | Viscosity Imparting Agent Type | Viscosity Imparting Agent (wt %) |
|---|---|---|---|---|---|---|---|---|---|---|---|
| Embodiment 701 | PC7AgAL | 70 wt % | 26 nm | 20 wt % | 200 nm | 77.7% | ② | Butanol | 6.0 | Oil of Turpentine | 4.0 |
| Embodiment 702 | PC7AgAL | 40 | 26 | 50 | 500 | 44.4 | ⑤ | Butanol | 6.0 | Oil of Turpentine | 4.0 |
| Embodiment 703 | PC7AgAL | 15 | 26 | 75 | 800 | 16.6 | ⑧ | Butanol | 6.0 | Oil of Turpentine | 4.0 |
| Embodiment 801 | PG8AgAL | 70 | 22 | 20 | 200 | 77.7% | ② | Ethanol | 6.0 | Terpene Derivative | 4.0 |
| Embodiment 802 | PC8AgAL | 40 | 22 | 50 | 500 | 44.4 | ⑤ | Ethanol | 6.0 | Terpene Derivative | 4.0 |
| Embodiment 803 | PC8AgAL | 15 | 22 | 75 | 800 | 16.6 | ⑧ | Ethanol | 6.0 | Terpene Derivative | 4.0 |
| Embodiment 901 | PC9AgAL | 70 | 20 | 20 | 200 | 77.7% | ② | Ethanol | 6.0 | Oil of Turpentine | 4.0 |
| Embodiment 902 | PC9AgAL | 40 | 20 | 50 | 500 | 44.4 | ⑤ | Ethanol | 6.0 | Oil of Turpentine | 4.0 |
| Embodiment 903 | PC9AgAL | 15 | 20 | 75 | 800 | 16.6 | ⑧ | Ethanol | 8.0 | Oil of Turpentine | 4.0 |
| Embodiment 101 | PC10AgAL | 70 | 18 | 20 | 200 | 77.7% | ② | Butanol | 8.0 | Terpene Derivative | 4.0 |
| Embodiment 102 | PC10AgAL | 40 | 18 | 50 | 500 | 44.4 | ⑤ | Butanol | 6.0 | Terpene Derivative | 4.0 |
| Embodiment 103 | PC10AgAL | 15 | 18 | 75 | 800 | 16.6 | ⑧ | Butanol | 6.0 | Terpene Derivative | 4.0 |
| Embodiment 111 | PC11AgAL | 70 | 14 | 20 | 200 | 77.7% | ② | Ethanol | 6.0 | Oil of Turpentine | 4.0 |
| Embodiment 112 | PC11AgAL | 40 | 14 | 50 | 500 | 44.4 | ⑤ | Ethanol | 6.0 | Oil of Turpentine | 4.0 |
| Embodiment 113 | PC11AgAL | 15 | 14 | 75 | 800 | 16.6 | ⑧ | Ethanol | 6.0 | Oil of Turpentine | 4.0 |
| Embodiment 121 | PC12AgAL | 70 | 11 | 20 | 200 | 77.7% | ② | Hexane | 6.0 | Terpene Derivative | 4.0 |
| Embodiment 122 | PC12AgAL | 40 | 11 | 50 | 500 | 44.4 | ⑤ | Hexane | 6.0 | Terpene Derivative | 4.0 |
| Embodiment 123 | PC12AgAL | 15 | 11 | 75 | 800 | 16.6 | ⑧ | Hexane | 6.0 | Terpene Derivative | 4.0 |

Figure 22:
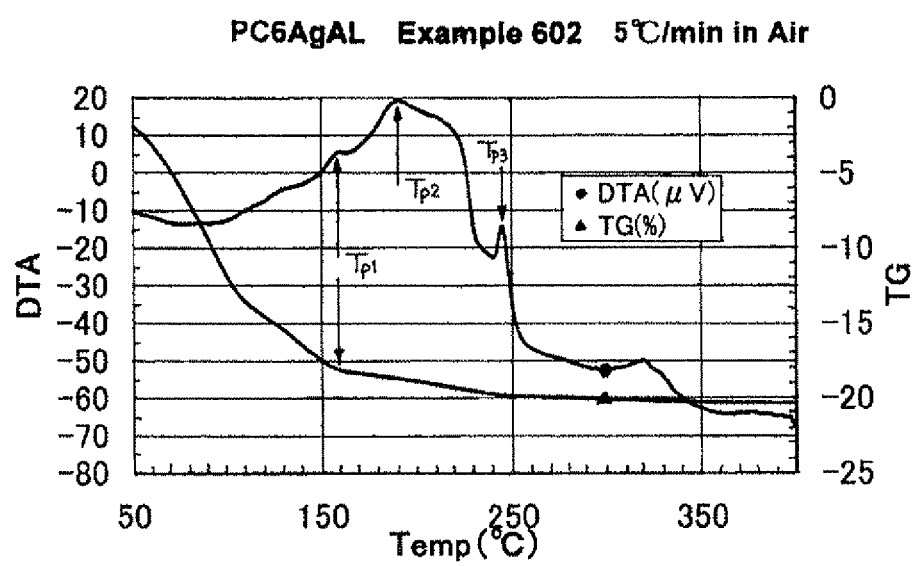
FIG. 22 is a thermal analysis graph (temperature increase rate: 5° C./min) of Embodiment 602 of PC6AgAL concerning the present invention

FIG. 22 is a thermal analysis graph in which PC6AgAL (Embodiment 602) was thermally analyzed under atmosphere at a temperature increase rate of 5° C./min. Tp1 indicates the paste decomposition start temperature, Tp2 the paste decomposition temperature, and Tp3 the paste metalization temperature (silverization temperature). Paste decomposition start temperature Tp1 is defined by the DTA increase start temperature. The first decrease of the TG curve shows an evaporation of the alcohol, and the next decrease indicates a decrease of the viscosity imparting agent. Therefore, if paste decomposition start temperature T1 is defined by TG, it can be defined by the TG decrease start temperature after the viscosity imparting agent has completely evaporated. Paste decomposition temperature Tp2 is defined with the earliest peak temperature (first peak temperature). There are two peaks in this DTA, and because the maximum peak is the first peak, the maximum peak temperature gives decomposition temperature Tp2. In FIG. 22, the second peak is lower from the first peak, but there are cases in which the second peak is higher. Therefore, paste decomposition temperature Tp2 is defined here by the earliest peak temperature (first peak temperature). The present inventors currently think that the first peak corresponds to the decomposition temperature of minute particles in the composite silver nanoparticles, and the second peak corresponds to the decomposition temperature of larger particles or aggregated particles within the composite silver nanoparticles. Paste metalization temperature Tp3 is defined by the end temperature of the last peak, but when the last peak is a steep peak, defining with the steep peak temperature does not cause much difference. This last peak is thought to give the temperature in which the silver cores of said minute particles, large particles, or aggregated particles that have become uncovered, and silver filler particles move mutually, to form a compact metal layer (silver layer). In FIG. 22, Tp1=130° C., Tp2=162° C., Tp3=203° C. were obtained.

Table 10 is a relational table of characteristic temperatures Tp1, Tp2, Tp3 of composite nanosilver pastes PC1AgAL-PC6AgAL. About PCnAgAL of Embodiments 101-603 (n=1-6), characteristic temperatures Tp1, Tp2, Tp3 were measured by thermally analyzing under atmosphere at a temperature increase rate of 1° C./min in the same manner as in FIG. 22. Metalization temperature Tp3 increases with the C number, and to be specific, it varies from 153° C. to 204° C. Tp3≦300° C. is established, and it shows that the present invention is a the composite nanosilver paste that can go through a firing at low temperature. From this table, it was demonstrated that Tp1<Tp2<Tp3 and Tp3≦300° C. are established.

TABLE 10

Characteristic Temperatures Tp1, Tp2, Tp3 of Two Metallic Component Composite Nanosilver Pastes (PC1AgAL~PC6AgAL) Temperature Increase Rate: 1° C./min

| Embodiment No. | Composite Nanosilver Paste (Expression formula) | CnAgAL wt % | CnAgAL Ave. Diam. | Silver Filler wt % | Silver Filler Ave. Diam. | Filling factor w/ (w + W) | Decomposition Start Temperature Tp1 (° C.) | Decomposition Temperature Tp2 (° C.) | Silverization Temperature Tp3(° C.) |
|---|---|---|---|---|---|---|---|---|---|
| Embodiment 101 | PC1AgAL | 70 wt % | 52 nm | 20 wt % | 300 nm | 77.7% | 81 | 117 | 156 |
| Embodiment 102 | PC1AgAL | 40 | 52 | 50 | 500 | 44.4 | 79 | 116 | 155 |
| Embodiment 103 | PC1AgAL | 15 | 52 | 75 | 700 | 16.6 | 78 | 114 | 153 |
| Embodiment 201 | PC2AgAL | 70 | 47 | 20 | 300 | 77.7 | 90 | 124 | 166 |
| Embodiment 202 | PC2AgAL | 40 | 47 | 50 | 500 | 44.4 | 89 | 121 | 186 |
| Embodiment 203 | PC2AgAL | 15 | 47 | 75 | 700 | 16.6 | 86 | 120 | 164 |
| Embodiment 301 | PC3AgAL | 70 | 45 | 20 | 300 | 77.7 | 100 | 132 | 174 |
| Embodiment 302 | PC3AgAL | 40 | 45 | 50 | 500 | 44.4 | 98 | 131 | 173 |
| Embodiment 303 | PC3AgAL | 15 | 45 | 75 | 700 | 16.6 | 98 | 130 | 171 |
| Embodiment 401 | PC4AgAL | 70 | 38 | 20 | 300 | 77.7 | 113 | 145 | 187 |
| Embodiment 402 | PC4AgAL | 40 | 38 | 50 | 500 | 44.4 | 111 | 144 | 185 |
| Embodiment 403 | PC4AgAL | 15 | 38 | 75 | 700 | 16.6 | 108 | 142 | 186 |
| Embodiment 501 | PC5AgAL | 70 | 34 | 20 | 300 | 77.7 | 128 | 159 | 192 |
| Embodiment 502 | PC5AgAL | 40 | 34 | 50 | 500 | 44.4 | 127 | 157 | 192 |
| Embodiment 503 | PC5AgAL | 15 | 34 | 75 | 700 | 16.6 | 125 | 158 | 192 |
| Embodiment 601 | PC6AgAL | 70 | 31 | 20 | 300 | 77.7 | 131 | 163 | 204 |
| Embodiment 602 | PC6AgAL | 40 | 31 | 50 | 500 | 44.4 | 130 | 162 | 203 |
| Embodiment 603 | PC6AgAL | 15 | 31 | 75 | 700 | 16.6 | 128 | 160 | 202 |

Table 11 is a relational table of characteristic temperatures Tp1, Tp2, Tp3 of composite nanosilver pastes PC7AgAL-PC12AgAL. On PCnAgAL of Embodiments 701-123 (n=7-12), characteristic temperatures Tp1, Tp2, Tp3 were measured by thermally analyzing under atmosphere at a temperature increase rate of 1° C./min, in the same manner as FIG. 22. Metalization temperature Tp3 increases with the C number, and specifically, it changes from 215° C. to 275° C. Tp3≦300° C. is established, and it shows that the present invention is a the composite nanosilver paste that can go through a firing at low temperature. From this table, it was demonstrated that Tp1<Tp2<Tp3 and Tp3≦300° C. are established.

TABLE 11

Characteristic Temperatures Tp1, Tp2, Tp3 of Two Metallic Component Composite Nanosilver Pastes (PG7AgAL~PC12AgAL) Temperature Increase Rate: 1° C./min

| Embodiment No. | Composite Nanosilver Paste (Expression formula) | CnAgAL wt % | CnAgAL Ave. Diam. | Silver Filler wt % | Silver Filler Ave. Diam. | Filling factor w/ (w + W) | Decomposition Start Temperature Tp1 (° C.) | Decomposition Temperature Tp2 (° C.) | Silverization Temperature Tp3(° C.) |
|---|---|---|---|---|---|---|---|---|---|
| Embodiment 701 | PC7AgAL | 70 wt % | 26 nm | 20 wt % | 200 nm | 77.7% | 144 | 180 | 218 |
| Embodiment 702 | PC7AgAL | 40 | 26 | 50 | 500 | 44.4 | 145 | 179 | 216 |
| Embodiment 703 | PC7AgAL | 15 | 26 | 75 | 800 | 16.6 | 142 | 176 | 215 |

TABLE 11-continued

Characteristic Temperatures Tp1, Tp2, Tp3 of Two Metallic Component Composite
Nanosilver Pastes (PG7AgAL~PC12AgAL) Temperature Increase Rate: 1° C./min

| Embodiment No. | Composite Nanosilver Paste (Expression formula) | CnAgAL wt % | CnAgAL Ave. Diam. | Silver Filler wt % | Silver Filler Ave. Diam. | Filling factor w/(w + W) | Decomposition Start Temperature Tp1 (° C.) | Decomposition Temperature Tp2 (° C.) | Silverization Temperature Tp3 (° C.) |
|---|---|---|---|---|---|---|---|---|---|
| Embodiment 801 | PG8AgAL | 70 | 22 | 20 | 200 | 77.7% | 154 | 188 | 229 |
| Embodiment 802 | PC8AgAL | 40 | 22 | 50 | 500 | 44.4 | 152 | 186 | 228 |
| Embodiment 803 | PC8AgAL | 15 | 22 | 75 | 800 | 16.6 | 151 | 185 | 227 |
| Embodiment 901 | PC9AgAL | 70 | 20 | 20 | 200 | 77.7% | 169 | 199 | 240 |
| Embodiment 902 | PC9AgAL | 40 | 20 | 50 | 500 | 44.4 | 168 | 198 | 239 |
| Embodiment 903 | PC9AgAL | 15 | 20 | 75 | 800 | 16.6 | 166 | 198 | 239 |
| Embodiment 101 | PC10AgAL | 70 | 18 | 20 | 200 | 77.7% | 177 | 206 | 248 |
| Embodiment 102 | PC10AgAL | 40 | 18 | 50 | 500 | 44.4 | 175 | 202 | 247 |
| Embodiment 103 | PC10AgAL | 15 | 18 | 75 | 800 | 16.6 | 175 | 202 | 246 |
| Embodiment 111 | PC11AgAL | 70 | 14 | 20 | 200 | 77.7% | 188 | 219 | 264 |
| Embodiment 112 | PC11AgAL | 40 | 14 | 50 | 500 | 44.4 | 186 | 218 | 260 |
| Embodiment 113 | PC11AgAL | 15 | 14 | 75 | 800 | 16.6 | 185 | 217 | 260 |
| Embodiment 121 | PC12AgAL | 70 | 11 | 20 | 200 | 77.7% | 202 | 235 | 275 |
| Embodiment 122 | PC12AgAL | 40 | 11 | 50 | 500 | 44.4 | 199 | 234 | 272 |
| Embodiment 123 | PC12AgAL | 15 | 11 | 75 | 800 | 16.6 | 198 | 232 | 271 |

Table 12 shows the temperature increase rate dependency of the characteristic temperatures in the thermal analyses of the C10AgAL powder (Embodiment 10) and the PC10AgAL paste (Embodiment 102). Tables 10-12 were put together, and the following results became clear by the thermal analyses of the PCnAgAL pastes under atmosphere at temperature increase rate VT=1° C./min. Here, the temperature unit is ° C.

$$Tp1 < Tp2 < Tp3 \quad (P1)$$

$$Tp2 - 100 < Tp1 < Tp2 \quad (P2)$$

$$Tp3 \leq 300 \quad (P3)$$

The above results are similar to the CnAgAL powders.

Furthermore, the next results were obtained by tests in which temperature increase rate VT was varied between 1-20(° C./min). VT (° C./min) is chosen from within a range of $1 \leq VT \leq 20$ (° C./min).

$$Tp1(VT) < Tp2(VT) < Tp3(VT) \quad (P4)$$

$$Tp2(VT) - 100 < Tp1(VT) < Tp2(VT) \quad (P5)$$

$$Tp3(VT) < Tp3(1° C./min) + 100 \quad (P6)$$

FIG. 23 is a characteristic temperature figure of CnAgAL and PCnAgAL concerning the present invention. In this figure, the following Equation (P7)-(P9) are described as well as the previously described Equations (P1)-(P6). The mutual relations of the characteristic temperatures of the CnAgAL powders and the PCnAgAL pastes are shown.

$$T1(VT) < Tp1(VT) < T1(VT) + 100 \quad (P7)$$

$$T2(VT) < Tp2(VT) < T2(VT) + 100 \quad (P8)$$

$$T3(VT) < Tp3(VT) < T3(VT) + 100 \quad (P9)$$

What these equations mean is that characteristic temperatures Tp1, Tp2, Tp3 of the paste are found above and within 100° C. of each of characteristic temperatures T1, T2, T3 of the powder.

FIG. 24 is manufacture process diagram of a diode resin mold body for bonding tests. In (24A), each of composite nanosilver paste layers 6, 12 are applied onto lead frames 2, 4. Diode chip 8 is placed on composite nanosilver paste layer 6, and composite nanosilver paste layer 10 is applied on diode chip 8. Lastly, diode assembly 1 is completed by placing both

TABLE 12

Temperature Increase Rate Dependence in Thermal Analyses of C10AgAl Powder (Embodiment 10) and PC10AgAL Paste (Embodiment 102)

| Temperature Increase Rate [° C./min] | Powder Decomposition Start Temperature $T_1$ [° C.] | Paste Decomposition Start Temperature $T_{P1}$ [° C.] | Powder Decomposition Temperature $T_2$ [° C.] | Paste Decomposition Temperature $T_{P2}$ [° C.] | Powder Metallization Temperature $T_3$ [° C.] | Paste Metallization Temperature $T_{P3}$ [° C.] |
|---|---|---|---|---|---|---|
| 1 | 104 | 175 | 175 | 202 | 189 | 247 |
| 3 | 126 | 193 | 195 | 227 | 234 | 270 |
| 5 | 143 | 200 | 206 | 237 | 243 | 282 |
| 10 | 146 | 216 | 213 | 252 | 257 | 306 |
| 15 | 150 | 218 | 223 | 259 | 267 | 313 |
| 20 | 159 | 225 | 228 | 267 | 275 | 328 | ends of connection terminal 14 on said composite nanosilver paste layers 10, 12. In (24B), said diode assembly 1 is sintered in electric furnace 16, and composite nanosilver paste layers 6, 10, 12 are converted into silver layers 6a, 10a, 12a. Furthermore, diode resin mold body 18 is completed by sealing said diode assembly 1 by resin mold 20 after sintering, and this diode resin mold body 18 is transferred to VF and ΔVF tests described below. The lead frames protruding from left and right become electrodes, anode 22 and cathode 24.

FIG. 25 is a test measurement diagram of VF and ΔVF of a diode resin mold body. In (25A), DC power supply 26 and ampere meter 28 are connected in series between said anode 22 and cathode 24, and DC voltage is applied variably. (25B) is an explanatory diagram of VF test. The forward voltage VF is measured for a flow of rated current IO. As forward voltage VF becomes smaller, the electric resistance of the bonding surface also becomes smaller, and because of this, it is found that it is in a good bonding state. (25C) is an explanatory diagram of ΔVF test. By the electric resistance in said bonding surface, Joule heat is generated if the forward current becomes large. Because this worsens the diode characteristics, it becomes important that the thermal conductivity is good. ΔVF test is done to examine this thermal conductivity. At the beginning, a minute current is flowed, and forward voltage VF is measured. After this, a large, predetermined electric current is flowed for a given time, and the forward voltage VF is measured immediately after. If the difference ΔVF is small, it signifies that heat is conducted efficiently through the bonding surface, and thus the bonding state is good. That is to say, electrical conductivity is measured by VF test, and thermal conductivity by ΔVF test.

Table 13 is a summary table of the VF and ΔVF values of two metallic component composite nanosilver pastes PC1AgAL-PC6AgAL under nitrogen and no-load. As a standard example, the VF and ΔVF values for a case in which a conventional high lead content solder was used are written together as standard values. Each value is standardized, with the values with the high lead content solder as 1.000. When the VF and ΔVF values are smaller than the reference values, it signifies a good result. If they are considerably smaller, the mark ⊚ is given; if they are slightly smaller, the mark ○; if they are at the same level, the mark Δ; and if both are large, the mark x. By the pastes of Embodiments 101-603, it was confirmed that the VF and ΔVF values were smaller than the reference values. Therefore, it was demonstrated that two metallic component composite nanosilver pastes PC1AgAL-PC6AgAL concerning the present invention are pastes that have completely cleared the practical use conditions. In addition, similar tests were done in Comparative Examples 1-4. Comparative Examples 2 and 3 were Δ, but Comparative Examples 1 and 4 were x. By the results above, it became clear that when filling factor w/(W+w) is within a range of 0.10-0.90, it is Δ, ○, or ⊚, and when it is less than or equal to 0.10, or greater than or equal to 0.90, it is x. Also, it became clear that at a boundary value such as 0.10 or 0.90, it is Δ. Therefore, it became clear that it is important to keep filling factor X within a range of $0.10 \leq X \leq 0.90$.

TABLE 13

Electric Characteristics of No-Load Bonding under Nitrogen of Two Metallic Component Composite Nanosilver Pastes (PC1AgAL~PC6AgAL): VF-ΔVF

| Embodiment No. | Composite Nanosilver Paste (Expression formula) | CnAgAL wt % | CnAgAL Ave. Diam. | Silver Filler wt % | Silver Filler Ave. Diam. | Filling factor w/(w + W) | VF | ΔVF | Overall Rating ⊚ ○ Δ x |
|---|---|---|---|---|---|---|---|---|---|
| Embodiment 101 | PC1AgAL | 70 wt % | 52 nm | 20 wt % | 300 nm | 77.7% | 1.000 | 0.999 | Δ |
| Embodiment 102 | PC1AgAL | 40 | 52 | 50 | 500 | 44.4 | 0.995 | 0.992 | ⊚ |
| Embodiment 103 | PC1AgAL | 15 | 52 | 75 | 700 | 16.6 | 0.997 | 0.996 | ○ |
| Embodiment 201 | PC2AgAL | 70 | 47 | 20 | 300 | 77.7 | 0.999 | 0.998 | ○ |
| Embodiment 202 | PC2AgAL | 40 | 47 | 50 | 500 | 44.4 | 0.996 | 0.993 | ⊚ |
| Embodiment 203 | PC2AgAL | 15 | 47 | 75 | 700 | 16.6 | 0.997 | 0.995 | ○ |
| Embodiment 301 | PC3AgAL | 70 | 45 | 20 | 300 | 77.7 | 1.000 | 0.998 | Δ |
| Embodiment 302 | PC3AgAL | 40 | 45 | 50 | 500 | 44.4 | 0.998 | 0.994 | ⊚ |
| Embodiment 303 | PC3AgAL | 15 | 45 | 75 | 700 | 16.6 | 0.998 | 0.996 | ○ |
| Embodiment 401 | PC4AgAL | 70 | 38 | 20 | 300 | 77.7 | 0.998 | 0.996 | ○ |
| Embodiment 402 | PC4AgAL | 40 | 38 | 50 | 500 | 44.4 | 0.996 | 0.993 | ⊚ |
| Embodiment 403 | PC4AgAL | 15 | 38 | 75 | 700 | 16.6 | 0.997 | 0.995 | ○ |
| Embodiment 501 | PC5AgAL | 70 | 34 | 20 | 300 | 77.7 | 1.000 | 0.997 | Δ |
| Embodiment 502 | PC5AgAL | 40 | 34 | 50 | 500 | 44.4 | 0.998 | 0.993 | ⊚ |
| Embodiment 503 | PC5AgAL | 15 | 34 | 75 | 700 | 16.6 | 0.997 | 0.996 | ○ |
| Embodiment 601 | PC6AgAL | 70 | 31 | 20 | 300 | 77.7 | 0.999 | 0.995 | ⊚ |
| Embodiment 602 | PC6AgAL | 40 | 31 | 50 | 500 | 44.4 | 0.996 | 0.994 | ⊚ |
| Embodiment 603 | PC6AgAL | 15 | 31 | 75 | 700 | 16.6 | 0.997 | 0.994 | ⊚ |
| Comparative Example 1 | PC2AgAL | 85 | 47 | 5 | 200 | 94.4 | 1.004 | 1.013 | x |
| Comparative Example 2 | PC4AgAL | 81 | 38 | 9 | 500 | 90.0 | 0.999 | 1.000 | Δ |
| Comparative Example 3 | PC6AgAL | 10 | 31 | 80 | 700 | 11.1 | 1.000 | 1.000 | Δ |
| Comparative Example 4 | PC6AgAL | 8 | 38 | 82 | 700 | 8.8 | 1.004 | 1.002 | x |
| Standard Example | High Lead Content Solder | | | | | | 1.000 | 1.000 | |

Rating Criteria:
⊚: VF, ΔVF much lower than high lead content solder
○: VF, ΔVF slightly lower than high lead content solder
Δ: VF, ΔVF approximately equal to high lead content solder
x: VF, ΔVF both higher than high lead content solder Table 14 is a summary table of the VF and ΔVF values of two metallic component composite nanosilver pastes PC7AgAL-PC12AgAL under nitrogen and no-load. Also in here, as a standard example, the VF and ΔVF values for a case in which a conventional high lead content solder was used are written together as standard values. As for the assessment standard, when the VF and ΔVF values are smaller than the reference values, it is assessed to be good. If they are considerably smaller, the mark ◎ is given; if they are slightly smaller, the mark ○; if they are at the same level, the mark Δ; and if both are large, the mark x. By the pastes of Embodiments 701-123, it was confirmed that the VF and ΔVF values were smaller than the reference values. Therefore, it was demonstrated that two metallic component composite nanosilver pastes PC7AgAL-PC12AgAL concerning the present invention are pastes that have completely cleared the practical use conditions. In addition, similar tests were done in Comparative Examples 5-8. Comparative Examples 6 and 7 were Δ, but Comparative Examples 5 and 8 were x. By the results above, in the same manner as Table 13, when filling factor w/(W+w) is within a range of 0.10-0.90, it is Δ, ○, or ◎, and when it is less than or equal to 0.10, or greater than or equal to 0.90, it is x. Also, it was understood that that at a boundary value such as 0.10 or 0.90, it becomes Δ. Therefore, it became clear that it is important to keep filling factor X within a range of $0.10 \leq X \leq 0.90$.

The present invention is not limited to the embodiments described above. Various modifications, design alterations, and others that do not involve a departure from the technical concept of the present invention are also included in the technical scope of the present invention.

INDUSTRIAL APPLICABILITY

According to the two metallic component type composite nanometal paste of the present invention, it was demonstrated that it produces high electrical and thermal conductivities in similar degree or higher than the conventional lead containing solders whose usage is permitted as an exception. Therefore, as well as general lead-free solders, lead-free solders that could be utilized as a substitute for high temperature high lead content solders permitted especially by the RoHS Directive are provided. Their extent of use is extremely wide, and they could be applied to various uses such as electronic materials such as bond materials, printed wiring, and electroconductive materials; magnetic materials such as magnetic storage media, electromagnetic wave absorbers, and electromagnetic wave resonators; structural materials such as far infrared materials and composite coating formation materials; ceramic or metallic materials such as sintering aids and coating materials; and medical materials.

TABLE 14

Electric Characteristics of No-Load Bonding under Nitrogen of Two Metallic Component Composite Nanosilver Pastes (PC7AgAL~PC12AgAL): VF-ΔVF

| Embodiment No. | Composite Nanosilver Paste (Expression formula) | CnAgAL wt % | CnAgAL Ave. Diam. | Silver Filler wt % | Silver Filler Ave. Diam. | Filling factor w/(w + W) | VF | ΔVF | Overall Rating ◎ ○ Δ x |
|---|---|---|---|---|---|---|---|---|---|
| Embodiment 701 | PC7AgAL | 70 wt % | 26 nm | 20 wt % | 200 nm | 77.7% | 1.000 | 1.000 | Δ |
| Embodiment 702 | PG7AgAL | 40 | 26 | 50 | 500 | 44.4 | 0.996 | 0.993 | ◎ |
| Embodiment 703 | PG7AgAL | 15 | 26 | 75 | 800 | 16.6 | 0.998 | 0.995 | ○ |
| Embodiment 801 | PC8AgAL | 70 | 22 | 20 | 200 | 77.7 | 0.999 | 0.997 | ○ |
| Embodiment 802 | PC8AgAL | 40 | 22 | 50 | 500 | 44.4 | 0.997 | 0.994 | ◎ |
| Embodiment 803 | PC8AgAL | 15 | 22 | 75 | 800 | 16.8 | 0.998 | 0.996 | ○ |
| Embodiment 901 | PC9AgAL | 70 | 20 | 20 | 200 | 77.7 | 1.000 | 0.999 | Δ |
| Embodiment 902 | PC9AsAL | 40 | 20 | 50 | 500 | 44.4 | 0.997 | 0.993 | ◎ |
| Embodiment 903 | PC9AgAL | 15 | 20 | 75 | 800 | 16.6 | 0.997 | 0.996 | ○ |
| Embodiment 101 | PC10AgAL | 70 | 18 | 20 | 200 | 77.7 | 0.998 | 0.996 | ○ |
| Embodiment 102 | PC10AgAL | 40 | 18 | 50 | 500 | 44.4 | 0.995 | 0.992 | ◎ |
| Embodiment 103 | PC10AgAL | 15 | 18 | 75 | 800 | 16.6 | 0.996 | 0.992 | ○ |
| Embodiment 111 | PC11AgAL | 70 | 14 | 20 | 200 | 77.7 | 1.000 | 0.998 | Δ |
| Embodiment 112 | PC11AgAL | 40 | 14 | 50 | 500 | 44,4 | 0.997 | 0.993 | ◎ |
| Embodiment 113 | PC11AgAL | 15 | 14 | 75 | 800 | 16.6 | 0.998 | 0.997 | ○ |
| Embodiment 121 | PC12AgAL | 70 | 11 | 20 | 200 | 77.7 | 1.000 | 0.999 | Δ |
| Embodiment 122 | PC12AgAL | 40 | 11 | 50 | 500 | 44.4 | 0.998 | 0.995 | ◎ |
| Embodiment 123 | PC12AgAL | 15 | 11 | 75 | 800 | 16.6 | 0.999 | 0.998 | ○ |
| Comparative Example 5 | PC8AgAL | 85 | 22 | 5 | 200 | 94.4 | 1.007 | 1.015 | x |
| Comparative Example 6 | PC10AgAL | 81 | 18 | 9 | 500 | 90.0 | 1.000 | 1.001 | x or Δ |
| Comparative Example 7 | PC12AgAL | 10 | 11 | 80 | 700 | 11.1 | 1.000 | 1.000 | Δ |
| Comparative Example 8 | PC12AgAL | 8 | 11 | 82 | 700 | 8.8 | 1.003 | 1.003 | x |
| Standard Example | High Lead Content Solder | | | | | | 1.000 | 1.000 | |

Rating Criteria:
◎: VF, ΔVF much lower than high lead content solder
○: VF, ΔVF slightly lower than high lead content solder
Δ: VF, ΔVF approximately equal to high lead content solder
X: VF, ΔVF both higher than high lead content solder

DENOTATION OF REFERENCE NUMERALS

| | |
|---|---|
| 1 | Diode assembly |
| 2 | Lead frame |
| 4 | Lead frame |
| 6 | Composite nanopaste layer |
| 6a | Silver layer |
| 8 | Diode chip |
| 10 | Composite nanopaste layer |
| 10a | Silver conductor layer |
| 12 | Composite nanopaste layer |
| 12a | Silver conductor layer |
| 14 | Connection terminal |
| 16 | Electric furnace |
| 18 | Diode resin mold body |
| 20 | Resin mold |
| 22 | Anode |
| 24 | Cathode |
| 26 | Direct current power supply |
| 28 | Ampere meter |
| VF | Forward voltage |
| ΔVF | Forward voltage difference |

The invention claimed is:

1. A two metallic component type composite nanometal paste, characterized in that
said two metallic component type composite nanometal paste contains, as metal components, two components of a composite metal nanoparticle on which an organic coating layer is formed at a circumference of a metal core with an average particle diameter of d(nm), and a metal filler particle with an average particle diameter of D(nm);
it has a first relation of $$d<D,$$

and a second relation of $$d<100(\text{nm});$$

and
when said organic coating layer volatilizes so that a metal layer is formed by sintering, the size relation between said average particle diameters d, D is set so that said composite metal nanoparticle can be embedded in a hollow four pocket formed when it is assumed that four said metal filler particles are placed so that they come in contact with a tetrahedron, where said composite metal nanoparticle and said metal filler particle sinter compactly.

2. The two metallic component type composite nanometal paste according to claim 1, wherein said size relation of said average particle diameters d, D is $$0<d<(\sqrt{3}/\sqrt{2}-1)D.$$

3. The two metallic component type composite nanometal paste according to claim 1 or 2, wherein,
when composition weight w (wt %) of said composite metal nanoparticle and composition weight W (wt %) of said metal filler particle are defined,
a lower limit value of w/(w+W) is set to k times a volume ratio of said four pocket with respect to a volume of a tetrahedron formed by centers of four said metal filler particles that are placed so that they come into contact, where k is within a range of $0<k\leq1$.

4. The two metallic component type composite nanometal paste according to claim 3, wherein a lower limit value of said w/(w+W) is set to a value of $$k\{1-3\sqrt{2}\cos^{-1}(1/3)+\pi\sqrt{2}\}.$$

5. The two metallic component type composite nanometal paste according to claim 3, wherein a value of said k is chosen within a range of $0.45\leq k\leq1$.

6. The two metallic component type composite nanometal paste according to claim 1 or 2, wherein, when
four said metal filler particles are separated mutually so that an enlarged tetrahedron is formed by said centers of four said metal filler particles, and
composition weight w (wt %) of said composite metal nanoparticle and composition weight W (wt %) of said metal filler particle are defined,
an upper limit value of w/(w+W) is decided by a condition in which another metal filler particle cannot be inserted from an outside of said enlarged tetrahedron into its four pocket.

7. The two metallic component type composite nanometal paste according to claim 6, wherein, when
in said enlarged tetrahedron, an average particle diameter of said metal filler particle is defined as R,
a separation distance between said metal filler particles is defined as 2α, $$\alpha/R=x,$$

and
a value of x is set at $0\leq x\leq1$,
an upper limit value of said w/(w+W) is set to a value of $$1-3\sqrt{2}\{\cos^{-1}(1/3)-\pi/3\}/(1+x)^3.$$

8. The two metallic component type composite nanometal paste according to claim 1 or 2, wherein, when composition weight w (wt %) of said composite metal nanoparticle and composition weight W (wt %) of said metal filler particle are defined, a value of w/(w+W) is adjusted within a range of 0.10-0.90.

9. The two metallic component type composite nanometal paste according to claim 1 or 2, wherein a solvent and/or a viscosity imparting agent has bee added to it.

10. The two metallic component type composite nanometal paste according to claim 1 or 2, wherein paste metalization temperature Tp3 (° C.) is less than or equal to 300° C., when said composite nanometal paste is thermally analyzed under atmosphere at temperature increase rate VT=1° C./min.

11. The two metallic component type composite nanometal paste according to claim 1 or 2, wherein paste metalization temperature Tp3(VT) satisfies $$Tp3(VT)<Tp3(1°\text{ C./min})+100,$$

where a unit of temperature is ° C., when said composite nanometal paste is thermally analyzed under atmosphere at temperature increase rate VT=1–20° C./min.

12. The two metallic component type composite nanometal paste according to claim 1 or 2, wherein paste decomposition start temperature Tp1(VT) and paste decomposition temperature Tp2(VT) satisfy $$Tp2(VT)-100<Tp1(VT)<Tp2(VT),$$

where a unit of temperature is °C., when said composite nanometal paste is thermally analyzed under atmosphere at temperature increase rate VT=1–20° C./min.

13. The two metallic component type composite nanometal paste according to claim 1 or 2, wherein, when said composite nanometal paste is thermally analyzed under atmosphere at temperature increase rate VT=1–20° C./min, paste decomposition start temperature Tp1(VT), paste decomposition temperature Tp2(VT), and paste metalization temperature Tp3(VT) increase with an increase of said temperature increase rate VT, while satisfying a relation of Tp1(VT)<Tp2(VT)<Tp3(VT), a unit of temperature being ° C.

14. The two metallic component type composite nanometal paste according to claim 1 or 2, wherein, when
said composite metal nanoparticle is thermally analyzed under atmosphere at temperature increase rate VT(° C./min), a unit of temperature being ° C., so that decomposition start temperature T1(VT), decomposition temperature T2(VT), along with metalization. temperature T3(VT) of said composite metal nanoparticle are defined,
and
said composite nanometal paste is thermally analyzed under atmosphere at temperature increase rate VT (° C./min), so that paste decomposition start temperature Tp1(VT), paste decomposition temperature Tp2(VT), along with paste metalization temperature Tp3(VT) of said composite nanometal paste are defined, one or more of $$T1(VT) < Tp1(VT) < T1(VT) + 100,$$

$$T2(VT) < Tp2(VT) < T2(VT) + 100,$$

$$T3(VT) < Tp3(VT) < T3(VT) + 100$$

are established.

15. A method of bonding, characterized in that the two metallic component type composite nanometal paste according to claim 1 or 2 is provided, a paste layer is formed between a lower body and an upper body by said composite nanometal paste, and said lower body and said upper body are bonded by sintering said paste layer into a metal layer by application of heat.

16. The method of bonding according to claim 15, wherein, when said lower body and said upper body are bonded through said metal layer under no-load or load, and under atmosphere or inert gas, an electric resistance at a time of electric current application between said upper body and said lower body, and a heat conduction to said lower body at heating of said upper body, become small in comparison with a case in which said bonding is done with a conventional high lead content solder.

17. An electronic component, characterized in that it was produced by the method of bonding according to claim 15.

* * * * *